United States Patent [19]

Anderson et al.

[11] 4,301,508
[45] Nov. 17, 1981

[54] DIGITAL PROCESSING SYSTEM FOR TIME-OF-DAY AND DEMAND METER DISPLAY

[75] Inventors: John A. Anderson, Mequon; Richard C. Born, Wauwatosa; Frank A. Knopf, Milwaukee; Richard R. Sabroff, Lake Mills; Herman P. Schutten, Elm Grove; Donald L. Van Zeeland, Franklin, all of Wis.

[73] Assignee: Eaton Corp., Cleveland, Ohio

[21] Appl. No.: 24,680

[22] Filed: Mar. 28, 1979

[51] Int. Cl.³ .................... G06F 15/20; G01R 19/165
[52] U.S. Cl. .................................. 364/483; 364/492; 324/116; 324/103 R
[58] Field of Search ............... 364/483, 492, 493, 464, 364/900; 235/92 MT, 92 EL; 324/116, 142, 103 R, 307/31

[56] References Cited

U.S. PATENT DOCUMENTS

| | | | |
|---|---|---|---|
| 3,602,703 | 8/1971 | Polenz | 364/492 |
| 4,050,020 | 9/1977 | Germer et al. | 364/483 |
| 4,077,061 | 2/1978 | Johnston et al. | 364/492 |
| 4,080,568 | 3/1978 | Funk | 364/464 |
| 4,081,746 | 3/1978 | Snyder et al. | 324/116 |
| 4,093,997 | 6/1978 | Germer | 364/900 |
| 4,106,095 | 8/1978 | Yarbrough | 364/483 |
| 4,153,936 | 5/1979 | Schmitz et al. | 364/493 |
| 4,162,530 | 7/1979 | Kusui et al. | 364/483 |
| 4,197,582 | 4/1980 | Johnson et al. | 324/116 |
| 4,199,717 | 4/1980 | Germer et al. | 324/116 |

*Primary Examiner*—Mark E. Nusbaum
*Assistant Examiner*—Gary Chin
*Attorney, Agent, or Firm*—Wm. A. Autio; Larry G. Vande Zande

[57] ABSTRACT

An A.C. electric power usage measuring and display system using microcomputer based digital processing. Power usage pulses optically sensed from a watthour meter rotary disc and time pulses sensed from the 60 Hz A.C. power line are input to a microprocessor that is programmed to calculate and display the day of the week 1 to 7, the time of day on a 24-hour clock basis, the total watthours and kilowatthours since the start of a billing period on a decimal basis, the peak interval watthours and kilowatthours on a decimal basis, the peak interval start time and end time on a 24-hour clock basis for a peak interval of predetermined time, the peak power demand in kilowatts on a decimal basis, the day of the peak demand on a weekly 1 to 7 basis, the time of the peak demand on a 24-hour clock basis, and the present demand in kilowatts on a decimal basis. This data is displayed in sequence along with a reference decimal number 1 to 12 on an electronic display built into the meter and visible through the glass cover thereof.

12 Claims, 19 Drawing Figures

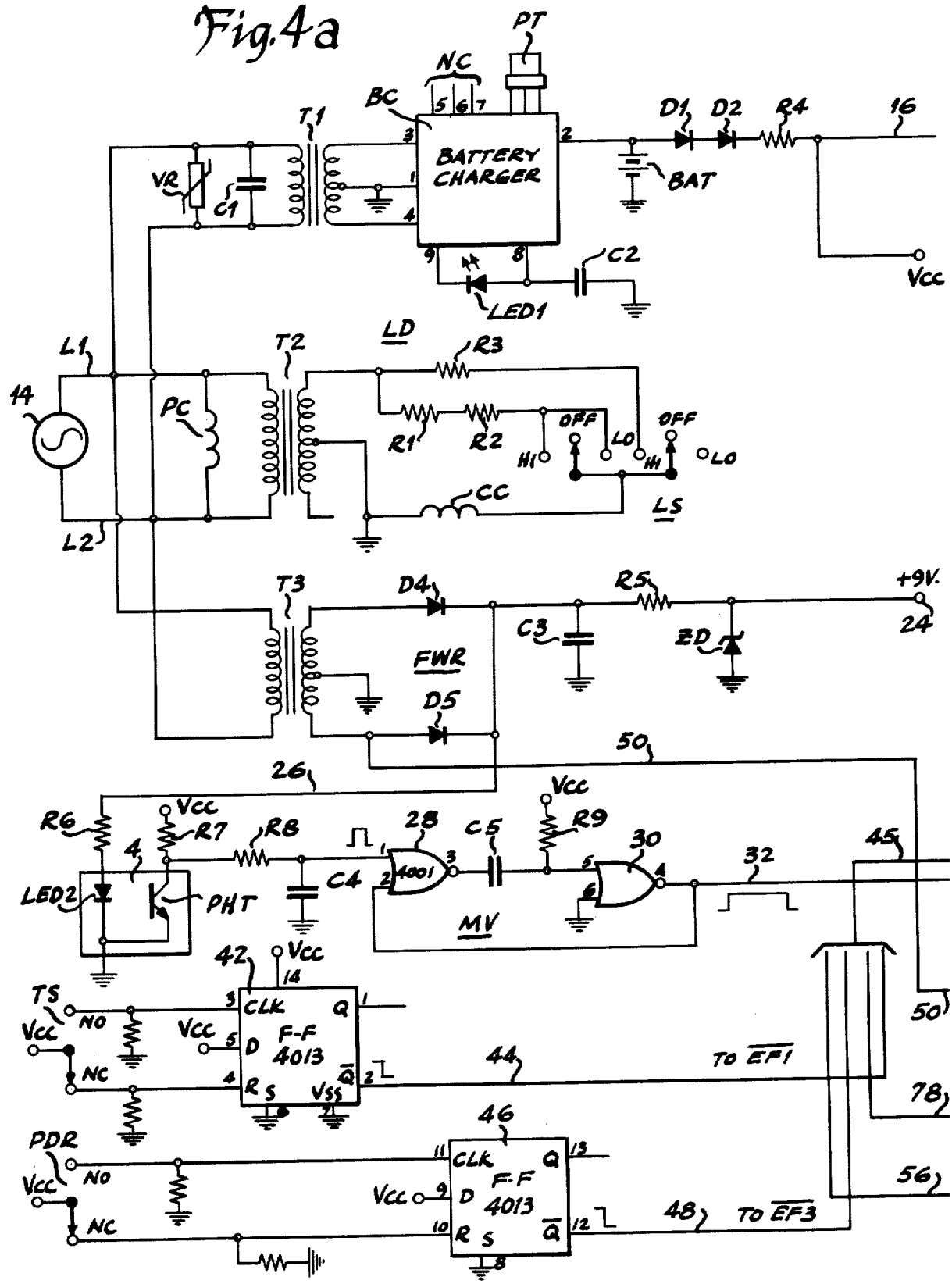

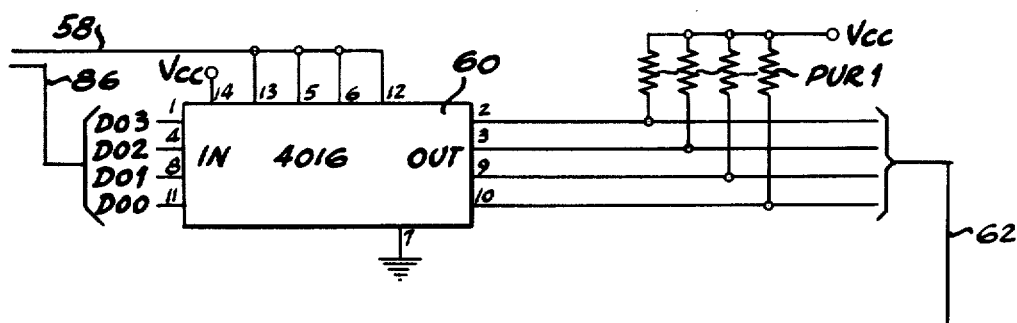
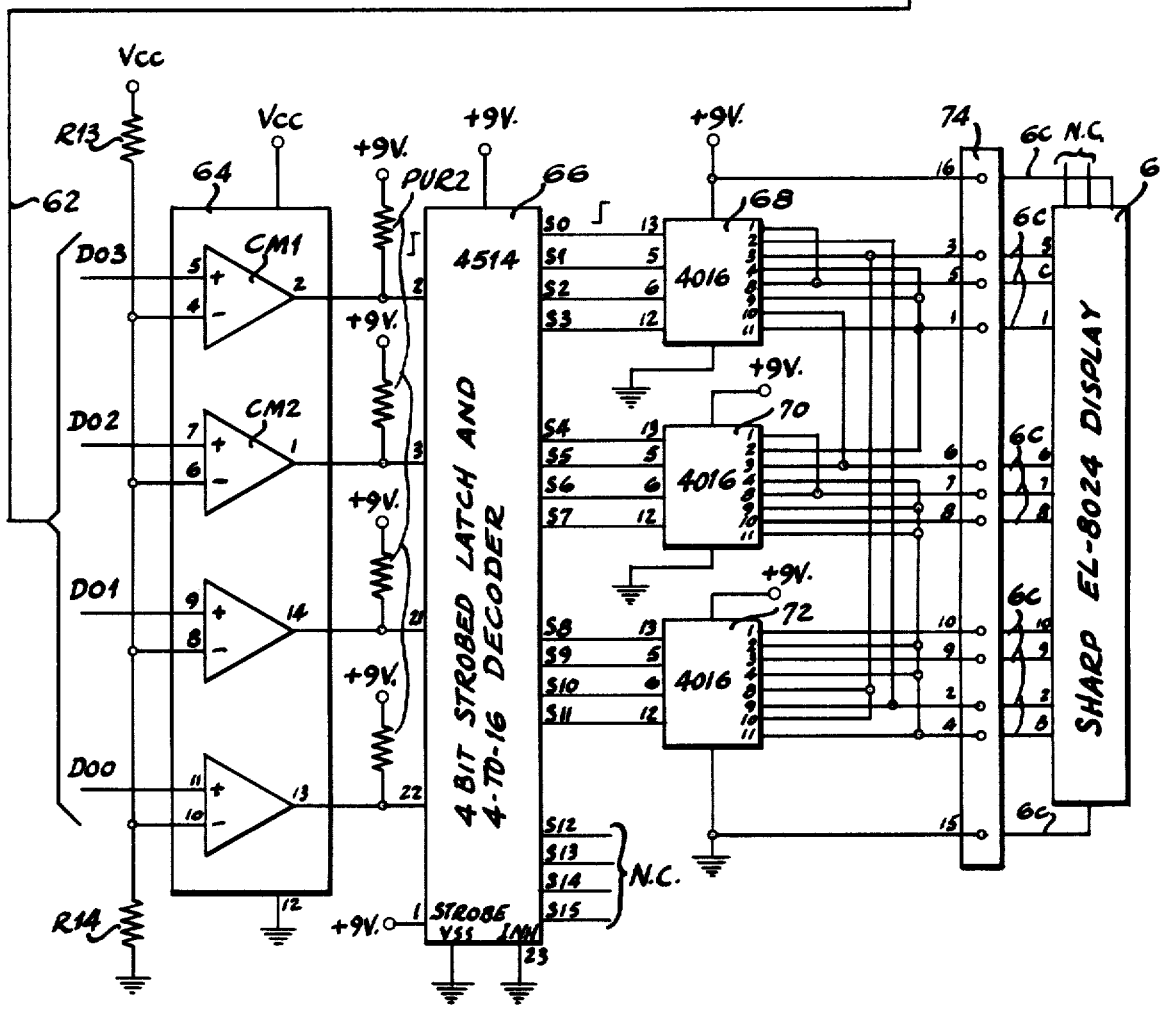
Fig. 4c
Fig. 5

CARRY SUB-SUBROUTINE

ADD 28.8 WATTS SUBROUTINE

NEW FW REPLACES OLD FW
CARRY IS IN R0.0

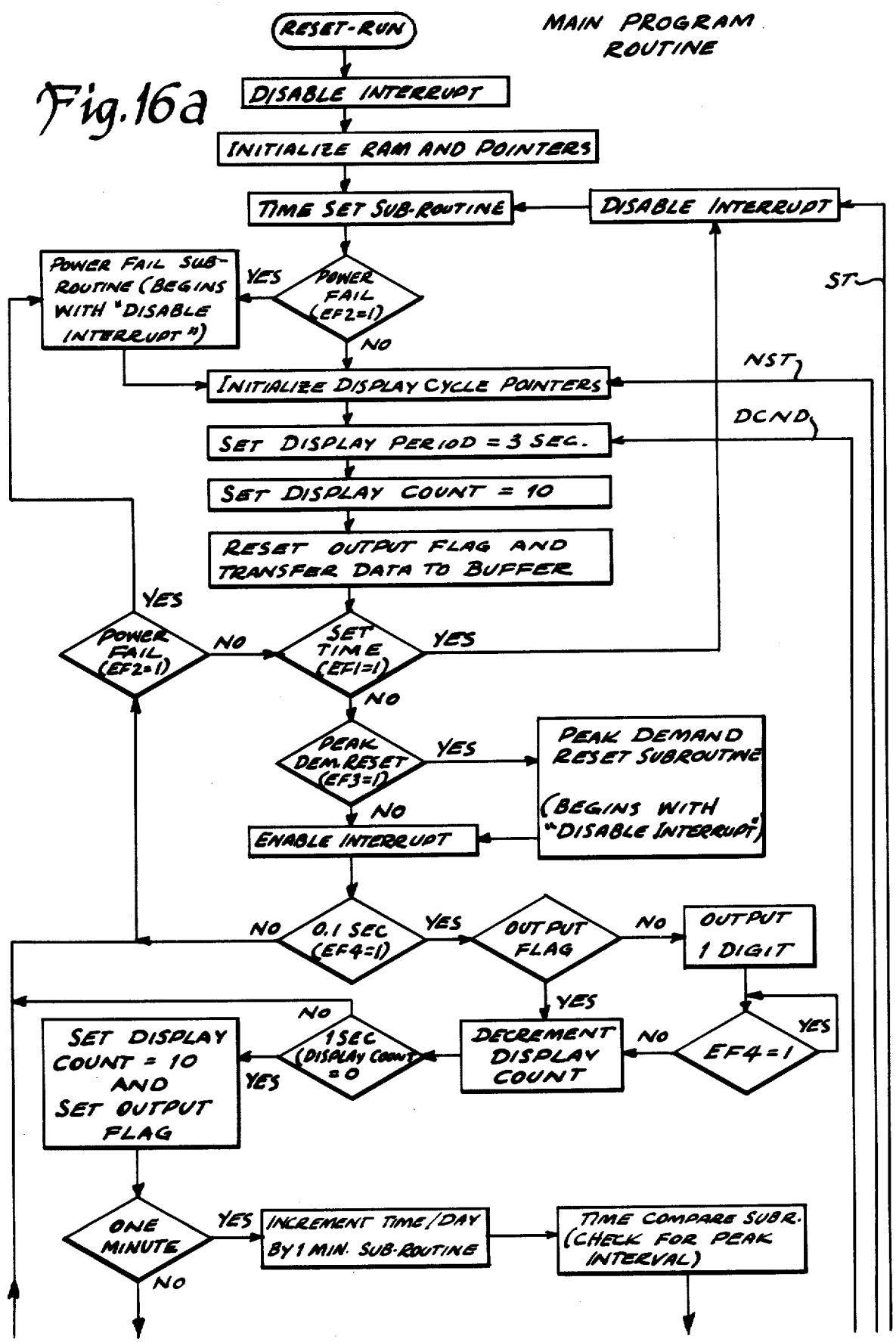

DIGITAL PROCESSING SYSTEM FOR TIME-OF-DAY AND DEMAND METER DISPLAY

BACKGROUND OF THE INVENTION

Optical sensing of watthour meter disc rotation has been known heretofore. For example, T. R. Polenz U.S. Pat. No. 3,602,703, dated Aug. 31, 1971, shows a photodetector for sensing six slots in the disc of a kilowatthour meter to provide pulses indicative of power usage. These pulses are used to control high-priority and low-priority loads. The control system estimates the total power requirements of the highest priority and other loads and allocates the available power thereto in a predetermined manner. Also, C. J. Snyder et al. U.S. Pat. No. 4,081,746, dated Mar. 28, 1978, shows a photoelectric pickup for sensing the passage of the anti-creep hole in the disc of a multiple-rate meter. The resultant pulses are used in the control system to cause the power usage to be totalized in a first register when the power usage is below a set point and to be totalized in a second register when the power usage is above the set point.

Electronic time-of-day metering systems have also been known. For example, W. R. Germer U.S. Pat. No. 4,050,020, dated Sept. 20, 1977, shows a KWH meter having three sets of dials including a standard KWH set, a first alternate (high-peak) rate set, and a second alternate (mid-peak) rate set that may be selectively clutched to the drive by the programmable control system depending on the time of day and the day of the week. The memory is pre-programmed for alternate meter operation. The system uses a 60 Hz power line time base clock and the clock time is compared to the stored time and a function control signal switches in an alternate set of meter dials. Also P. M. Johnston et al. U.S. Pat. No. 4,077,061, dated Feb. 28, 1978, shows a digital processing and calculating AC electric energy metering system that uses high-speed analog sampling of power voltage and current waves for accurate power measurement. These analog signals are converted to binary representation and processed in a programmed sequence controller and calculator to produce visual displays and output signals of hereinafter described electric energy parameters to be measured. Data pulses are transmitted through a remote metering telemetry system or for being recorded in a magnetic recorder type of receiver device. Input and output interfaces are used between the input signal sampling device and the processing system. A microprocessor is used for the calculations of certain parameters including kilowatt hours, Q-hour and volts squared as well as peak power usage or kilowatt demand and made available for direct input to the readout display. Manual switches are used to select the parameter to be displayed.

While these prior systems have been useful for their intended purposes, this invention relates to improvements thereover.

SUMMARY OF THE INVENTION

An object of the invention is to provide an improved A.C. electric energy usage calculating and display system of the microprocessor based type incorporated with and at least partly housed within the transparent enclosure of an induction-type watthour meter.

A more specific object of the invention is to provide improved means for mounting an optical pickup and an electronic multi-digit display device within the transparent enclosure of a standard induction watthour meter.

Another specific object of the invention is to provide improved integral electronic means in combination with a standard induction watthour meter for displaying the peak power demand for any interval selected along with the day and time of such peak demand.

Another specific object of the invention is to provide improved integral electronic means in combination with a standard induction watthour meter for displaying peak interval power usage along with the start and end times for such peak interval.

Another specific object of the invention is to provide improved electronic display means within the transparent enclosure of a standard induction watthour meter for displaying a plurality of power usage parameters along with the day of the week and the time of day, all on a decimal basis.

Another specific object of the invention is to provide improved microprocessor based electronic means for presetting peak interval start and end times and for displaying peak interval kilowatthours and watthours along with the peak interval start and end times on a decimal basis.

Another specific object of the invention is to implement an improved means for utilizing and augmenting a standard meter's capability without degrading its proven accuracy and reliability.

Another specific object of the invention is to utilize a standard meter's watthour totalizing system as a check and verification of the accuracy and integrity of an electronic system of the aforementioned type.

Another specific object of the invention is to provide improved logic circuit means in combination with a microprocessor and memory as well as optical pickup and electronic digital display means integral with a standard induction kilowatthour meter affording a simple and economical system for calculating and displaying a multiplicity of electric energy usage parameters along with date and time.

Other objects and advantages of the invention will hereinafter appear.

BRIEF DESCRIPTION OF THE DRAWINGS

FIGS. 4a, 4b and 4c, when assembled as shown in FIG. 5, show a mechanization and logic diagram of the digital processing system for time-of-day meter display constructed in accordance with the invention;

FIG. 5 is a block diagram showing how FIGS. 4a–c are to be assembled to show the system;

FIGS. 16a and 16b show a flow chart of the main program routine for controlling the sequence of operation of the system shown in FIGS. 1-3 and 4a-c.

DESCRIPTION OF THE PREFERRED EMBODIMENT

Figure 1:
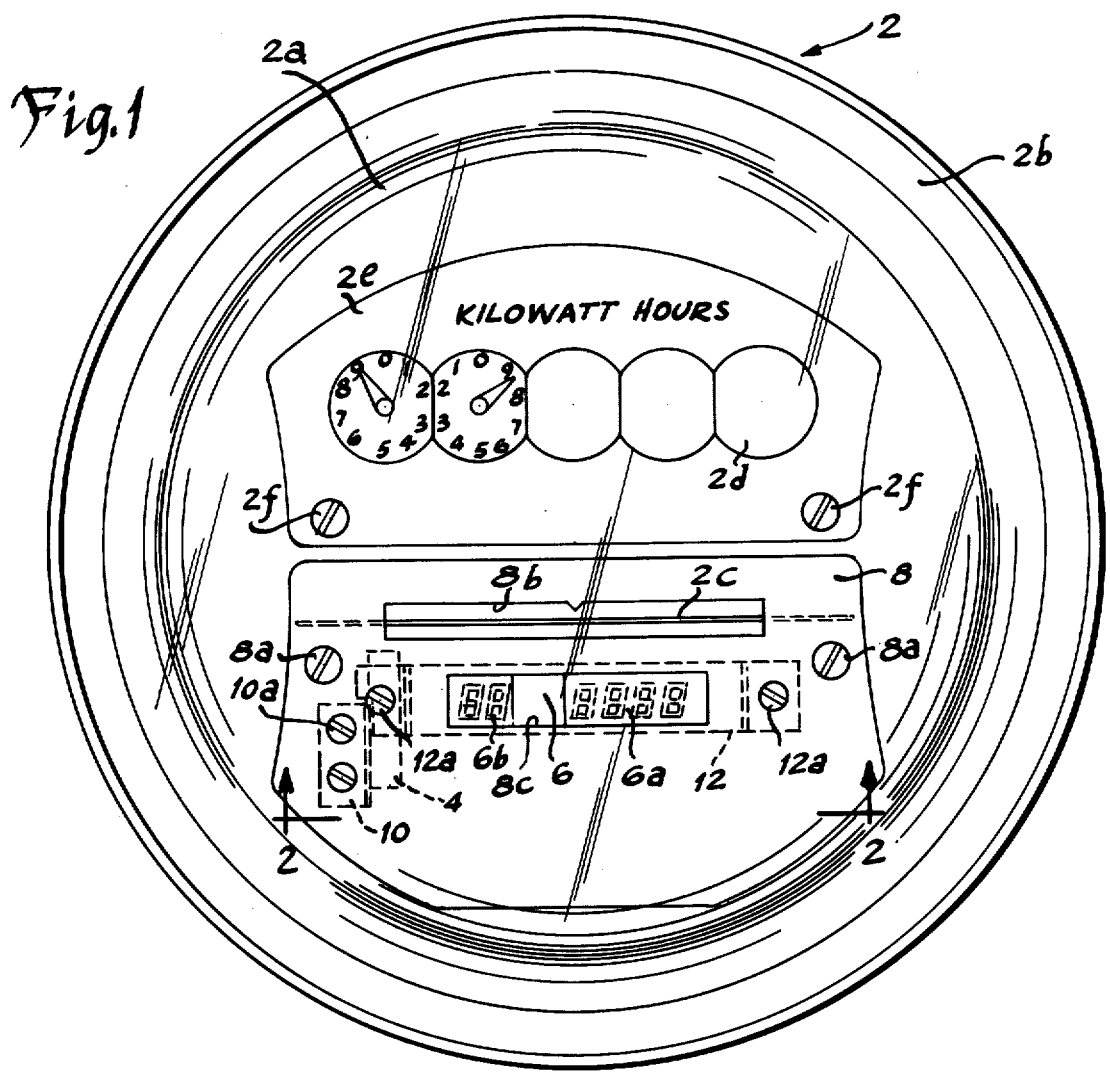
FIG. 1 is a front view of an induction-type kilowatthour meter modified to incorporate an optical pickup and electronic decimal display below the standard kilowatthour dials within the glass cover thereof.
Figures 2, 3:
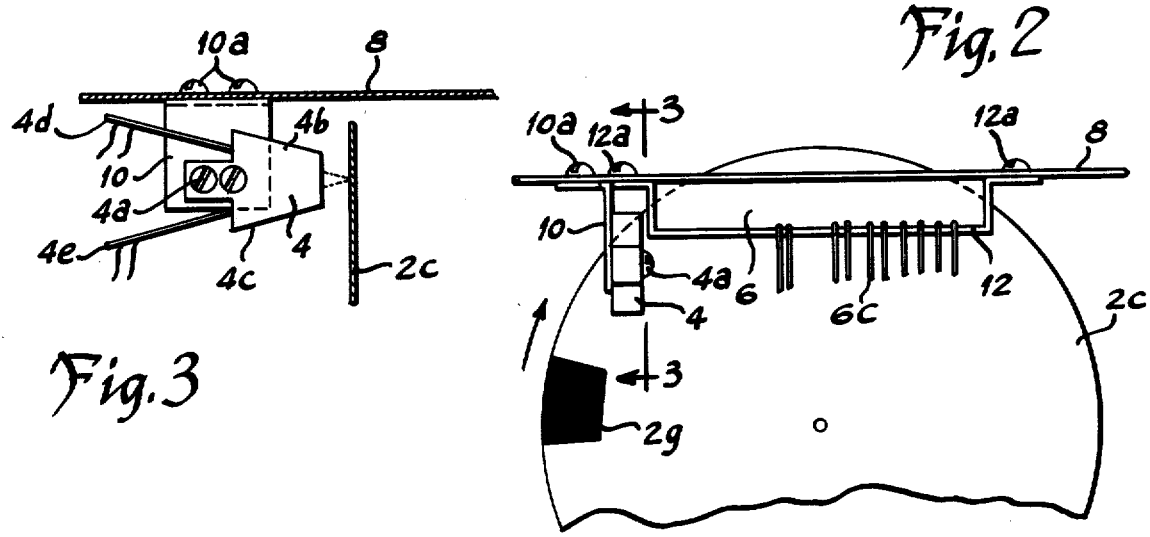
FIG. 2 is a fragmentary cross-sectional view taken substantially along line 2—2 of FIG. 1 to show the mounting brackets of the optical pickup and electronic display and the black spot on the disc that is sensed on each revolution.
FIG. 3 is a fragmentary cross-sectional view taken substantially along line 3—3 of FIG. 2 to show a right side view of the optical pickup and its relationship to the meter disc.

Referring to FIGS. 1-3, there is shown a standard induction kilowatthour meter 2 modified to incorporate an optical pickup 4 and an electronic display 6 therewithin so that the display is clearly visible through the transparent glass cover 2a of the meter. As shown in FIG. 1, this meter is provided with a mounting base 2b whereby it is mounted to a wall or the like. The induction mechanism is mounted to the base and serves to rotate metal disc 2c in proportion to the power usage which is normally indicated on a set of five dials 2d at the upper portion of the meter face, this dial reading being in kilowatthours as indicated thereabove. This meter face comprises two plates including an upper plate 2e for the set of dials 2d and a modified lower plate 8, both these plates being secured to the meter frame therebelow by screws 2f and 8a, respectively.

This lower plate 8 is provided with an elongated slot 8b through which the forward periphery of disc 2c extends so as to render its rotation visible. A generally L-shaped bracket 10 has its foot portion secured by a pair of screws 10a to the rear surface of plate 8 as shown in FIGS. 2 and 3. Optical pickup 4 is secured by a pair of screws 4a to the rearwardly-extending shank portion of L-shaped bracket 10 so that it is directed toward the rim portion of disc 2c as shown in FIG. 2. This optical pickup comprises a molded plastic housing having converging upper and lower sides 4b and 4c as shown in FIG. 3 and supporting therewithin a light source such as an LED (light emitting diode) and a photoelectric pickup such as a phototransistor arranged angularly generally according to the converging sides so that the light from the LED impinges on disc 2c and is reflected to the phototransistor as indicated by dotted lines in FIG. 3. This LED2 and phototransistor PHT are shown in the circuit diagram in FIG. 4a. However, when black spot 2g on the disc shown in FIG. 2 passes by the pickup, the reflection is interrupted to provide a count pulse indicative of one revolution of the disc as hereinafter described in connection with FIG. 4a. Terminals 4d and 4e are connected to the LED and phototransistor, respectively, and are connected by pairs of wires to the circuit of FIG. 4a hereinafter described. Alternatively, a fibre optic light source and receiver could be used in place of device 4.

The meter is also provided with means for mounting electronic display 6 so that it is visible through the glass cover. For this purpose, mounting plate 8 is provided with an elongated slot 8c below disc slot 8b as shown in FIG. 1. Electronic display 6 is supported behind this slot by a shallow U-shaped bracket 12 having the ends of its arms bent laterally in opposite directions and secured to plate 8 by a pair of screws 12a, one at each end, as shown in FIG. 2. This electronic display 6 may be similar to an electronic calculator display of the LED or LCD (liquid crystal display) type. As shown in FIG. 1, this is an 8-digit display with the fifth and sixth digits, counting from the right to left, covered to provide a 4-digit data display 6a at the right and a 2-digit identification number display 6b at the left separated by the two covered digits and visible through slot 8c in the mounting plate. As generally indicated in FIG. 2, a plurality of electric wires 6c extend from this display for connection in the system shown in FIG. 4c hereinafter described.

Figure 4B:
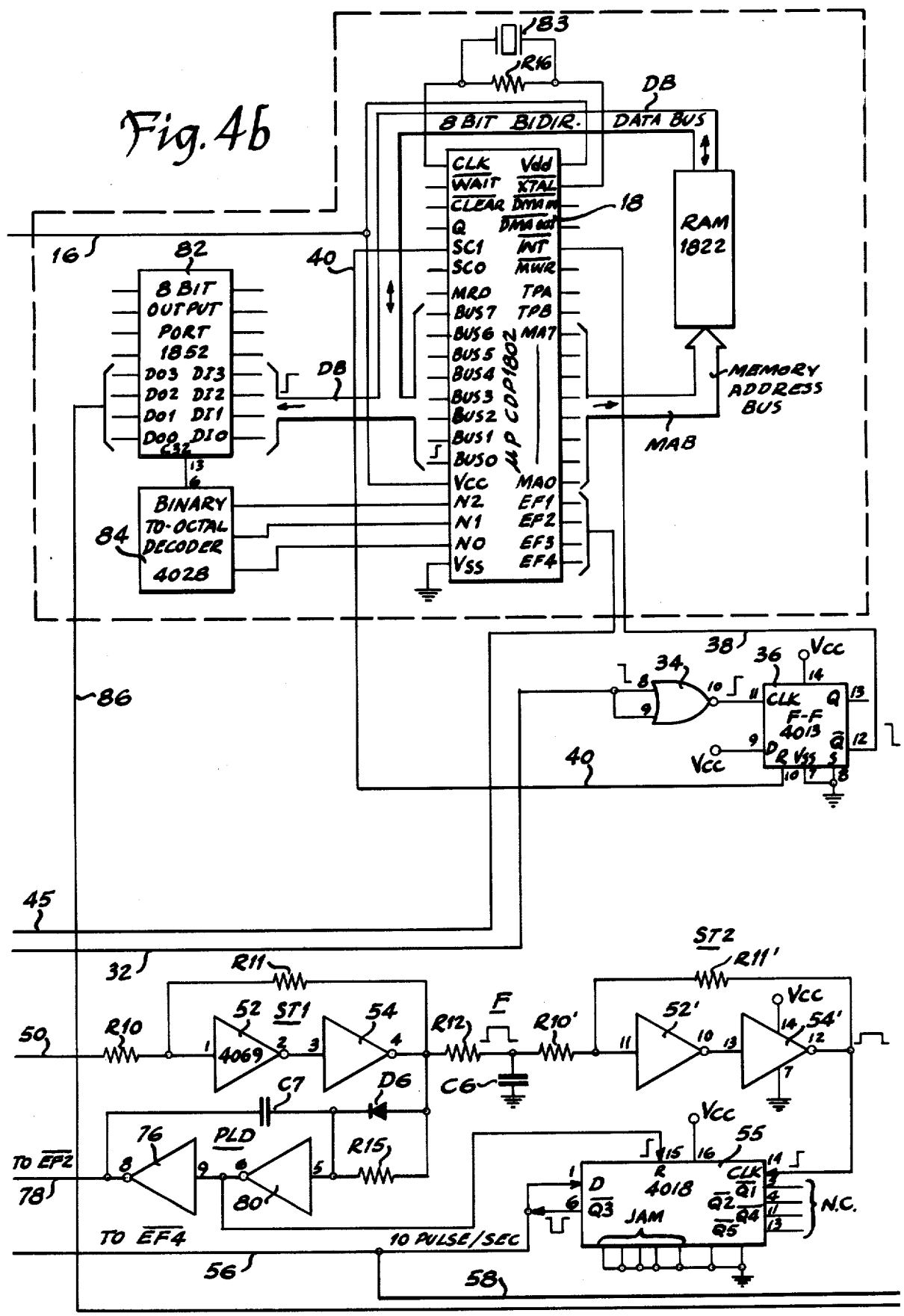

The system shown in FIG. 4a-c is a microprocessor or microcomputer based system that is programmed in accordance with the flow diagrams shown in FIGS. 6-15 and 16a-b and the program at the end of this specification. It will respond to time indicative input pulses from the 60 Hz power line and to power usage indicative input pulses from the optical pickup adjacent the meter disc. This system will execute the program repeatedly and will compute the following data and display it along with its identification number:

| Ident. No. | Data |
| --- | --- |
| 1 | Day of week |
| 2 | Time of day |
| 3 | Total WH (watthours) |
| 4 | Total KWH (kilowatthours) |
| 5 | Peak interval WH |
| 6 | Peak interval KWH |
| 7 | Peak interval start time |
| 8 | Peak interval end time |
| 9 | Peak power demand in KW's |
| 10 | Day of peak demand |
| 11 | Time of peak demand |
| 12 | Present demand in KW's |

The above 12 units of data will be displayed one at a time in sequence on the 4-digit portion 6a of the display shown in FIG. 1 accompanied each time by its identification number on the 2-digit portion 6b of the display. Both the identification number and the data will be displayed in decimal digits so that it is readily comprehensible. Both the total KWH and the total WH must be considered to obtain the total power usage reading because whenever the total WH reaches 1,000, the total KWH is incremented by one and the WH is reset to zero. The peak interval WH and peak interval KWH are managed in a similar manner requiring consideration of both to obtain the correct reading.

General Description of Logic Diagram

A mechanization and logic diagram of the digital processing system for the time-of-day meter display is shown in FIGS. 4a to 4c when the sheets that include these figures are arranged as shown in FIG. 5. Only so much of the kilowatthour meter and the microcomputer with associated logic and other elements is shown in this logic diagram as is necessary for an understanding of the invention.

The upper left-hand portion of this logic diagram shows the power line connections to the induction meter coils and to selective high and low load devices hereinafter more specifically described. This portion of the logic diagram also shows connections from the power line to a battery charger and standby battery and D.C. power outputs therefrom to the microprocessor and other logic circuits. Further connections from this power line go to a full-wave rectifier power supply circuit for supplying 9 volts D.C. to the display control logic circuits in FIG. 4c.

Further down the left side of this logic diagram, there is shown the optical pickup circuit and associated pulse shaping means. Also, a time set switch and a peak demand reset switch and associated debouncing flip-flops are shown at the lower left-hand portion of this logic diagram.

Referring now to the upper right-hand portion FIG. 4b of this logic diagram, there is shown the aforementioned portions of the microcomputer including a microprocessor DIP (dual in-line package), a RAM (random access memory), and an I/O (input-output) port and associated decoder.

At the lower mid-portion of this logic diagram there is shown a continuation of the logic circuits for controlling the energy usage pulse coming from the optical pickup and going to the interrupt terminal of the microprocessor. Directly therebelow, the logic diagram has logic circuitry for receiving a 60 Hz signal from the A.C. power line and for conditioning this signal to provide time clock pulses to the microprocessor, to switch the data from the output port to the electronic display, and to provide a shortly-delayed power fail signal to transfer from the 60 Hz time base to a programmed time base so as not to lose track of the time during power failure.

Detailed Description of Logic Diagram

As shown in FIG. 4a, A.C. electric power is applied from a power supply source 14 to power lines L1 and L2. This power is applied from lines L1 and L2 across potential coil PC of the KWH meter and the primary winding of transformer T2 in parallel. The secondary winding of the transformer applies a current through a series circuit including current coil CC of the KWH meter, a double-pole double-throw load selector switch LS and a load device LD. As shown, the load selector switch can be thrown from off position in one direction to terminals HI to select a high load having one branch with resistors R1 and R2 in series and a parallel branch with resistor R3 therein. Thrown in the other direction to terminals LO, this switch selects a low load having resistors R1 and R2 in series and the other branch resistor R3 being disconnected. It will, therefore, be apparent that in the HI position the KWH meter disc will rotate faster than in the LO position of the selector switch and that load device LD is representative of actual loads in use.

The D.C. logic supply and standby battery charging circuit is supplied from the center-tapped secondary winding of a transformer T1 having its primary winding connected across power lines L1 and L2, and there being a capacitor C1 and a varistor VR connected in parallel across this primary winding for protection against voltage transient peaks. Both sides of the secondary winding and the center tap are connected to a battery charger module BC such as a Gates HL2-6 type or the like having an external power transistor PT accessible for heat sinking purposes, a red light-emitting diode LED1 to indicate high rate charging, and a capacitor C2 to ground. Battery BAT is connected from output 2 of charger BC to ground, such output being also connected through voltage control means including a pair of unidirectional diodes D1 and D2 and a small resistor R4 to conductor 16. This conductor 16 supplies D.C. voltage to terminals Vdd and Vcc of microprocessor 18 and through voltage distribution terminal Vcc to various parts of the logic circuit.

A D.C. power supply of different value such as plus 9 volts is provided from power lines L1 and L2 through a transformer T3, full-wave rectifier FWR having diodes D4 and D5, a filter capacitor C3 to ground, a series resistor R5, a voltage regulating zener diode ZD to ground, and through voltage distribution terminal 24 to supply the display logic control circuits in FIG. 4c, these logic circuits requiring a different voltage magnitude than the microcomputer.

Full-wave rectifier FWR also supplies power through conductor 26, resistor R6 and light-emitting diode LED2 to ground to light this diode in the optical pickup 4, the latter having also a phototransistor PHT. The collector of this phototransistor is supplied by voltage Vcc through a resistor R7 while its emitter is connected to ground. An output from the collector of the phototransistor is applied through a pulse shaping circuit as follows.

This pulse shaping circuit comprises a resistor R8 and a small capacitor C4 in series to ground for transient suppression with the junction therebetween connected to a one-shot (monostable) multivibrator MV. This one-shot multivibrator MV is a conventional circuit having a two-input NOR logic 28 of the 4001 type to one input of which the positive pulse output of the optical pickup is applied. The output of NOR logic 28 is connected through a pulse timing capacitor C5 to a first input of a second two-input NOR logic 30. Voltage Vcc is connected through a pulse timing resistor R9 also to the right hand side of capacitor C5. The second input of NOR logic 30 is connected to ground. The output of NOR logic 30 is connected to the second input of NOR logic 28 as well as through conductor 32 and an inverting NOR logic 34 to the clock input CLK of a temporary storage device such as a D-type flip-flop 36 of the 4013 type whose data input D is permanently connected to "high" at voltage Vcc. This flip-flop is set by the pulse from the optical pickup and its $\overline{Q}$ output (low) is connected by conductor 38 to the interrupt input $\overline{INT}$ of microprocessor 18. This interrupt request input causes initiation of the interrupt routine and as soon as this interrupt routine is started, the microprocessor acknowledges it by providing an output signal from its state code terminal SC1 through conductor 40 to reset input R of flip-flop 36.

A pair of manual pushbutton switches are shown in FIG. 4a including a time set switch TS and a peak demand reset switch PDR. These are single-pole, double-throw momentary switches wherein depression of the pushbutton causes the movable contact to move from the normally-closed stationary contact NC to the normally-open stationary contact NO. As shown in FIG. 4a, contact NO of switch TS is connected to clock terminal CLK of D-type flip-flop 42 of the 4013 type and contact NC is connected to reset terminal R of this flip-flop whose data input D is connected to "high" at voltage Vcc. As a result, when the pushbutton switch is pressed, flip-flop 42 is set and when the pushbutton is released, flip-flop 42 is reset. When so set, a low signal is applied from its $\overline{Q}$ output through conductor 44 and 45 to external flag terminal $\overline{EF1}$ of the microprocessor in FIG. 4b.

This external flag terminal $\overline{EF1}$ input advances the day of the week the first time switch TS is pressed. That is, as long as this switch is held down, the microprocessor will repeatedly test this external flag and increment the day of the week from 1 through 7 and repeat. Therefore, to set the day of the week, this time set switch must be released at the moment when the microprocessor has incremented to the correct day of the week. This incrementing is displayed on the decimal display shown in FIGS. 1 and 4c as hereinafter described so that the operator will know when to release the pushbutton.

The second time this switch TS is pressed, the hours will be incremented and displayed 1 through 24 and repeated so that upon release of the pushbutton at the critical point, the correct hour will be set.

The third time this time set switch TS is pressed, the minutes will be incremented 1 through 60 and repeated so that upon release of the pushbutton at the critical moment as observed on the display, the correct minute will be set.

After this day, hour and minute presetting, the system will run the electronic clock to keep time as hereinafter described.

The aforementioned peak demand reset switch PDR is connected at its normally-closed stationary contact NC to reset terminal R of D-type flip-flop 46 of the 4013 type and its normally-open stationary contact NO is connected to clock input CLK of this flip-flop so that upon each depression of this switch, the flip-flop is clocked to its set state inasmuch as its data terminal D is permanently connected to "high" at voltage Vcc. In such set state, flip-flop 46 applies a low signal from its $\overline{Q}$ output through conductor 48 and 45 to external flag terminal $\overline{EF3}$ of the microprocessor. The microprocessor tests the status of these external flags of the start of each program execute cycle. This flag $\overline{EF3}$ causes the microprocessor to execute the peak demand reset subroutine whereby the peak demand time and day and KW are reset to zero and a new peak demand period of 15 minutes or the like started. The stationary contacts of switches TS and PDR are connected through respective resistors to ground so that when voltage Vcc is disconnected therefrom the corresponding flip-flop terminal is pulled down to ground (low). Flip-flops 42 and 46 are two elements of a dual IC chip so that the operating voltage applied to flip-flop 42 is applied internally to flip-flop 46.

The system shown in FIG. 4a-c also has means for providing a 60 Hz power line frequency based time clock. For this purpose, a 60 Hz signal is taken from the secondary winding of transformer T3 in FIG. 4a and applied thrugh conductor 50 to a pulse-shaping circuit which comprises a first Schmitt trigger circuit ST1, a filter F, and a second Schmitt trigger circuit ST2. Each of these trigger circuits comprises a resistor R10 and a pair of inverters 52 and 54 of the 4069 type in series and the output of the second inverter being connected through a resistor R11 to the input of the first inverter. This Schmitt trigger circuit is a bistable pulse generator whose output pulse of constant amplitude exists only as long as the input voltage exceeds a certain value. Consequently, this first Schmitt trigger circuit ST1 responds to the positive half-cycles of the 60 Hz sine wave voltage of the power line to provide square wave pulses. These square wave pulses are filtered in filter F comprising a series resistor R12 and a shunt capacitor C6 to ground and are then applied to second Schmitt trigger circuit ST2 to restore the square shape of the timing pulses that were rounded to some extent by filter F. This second Schmitt trigger circuit is like the first one and like reference characters with an added prime are used for the components thereof. While only one of the inverters in these Schmitt trigger circuits is shown as connected to voltage Vcc and ground, it will be apparent that all of them are similarly supplied with operating voltage internally on a plural-inverter CMOS chip.

The 60 Hz output pulses from Schmitt trigger circuit ST2 are applied to clock input CLK of a divide-by-N counter 55 of the 4018 type connected for divide-by-6 operation thereby to provide 10 pulses per second from its output terminal 6. These timing pulses are applied through conductor 56 and 45 to external flag terminal $\overline{EF4}$ of the microprocessor to enable the latter to keep track of time.

This time keeping is done by incrementing the minutes by one on the 10th pulse count after 59 seconds, by incrementing the hours on the next minute count after 59 minutes, by incrementing the days by one on the next hour count after 23 hours, and by resetting the day of the week count to 1 after 7 days.

The ten pulses per second from divide-by-six counter 55 are also applied through conductor 58 to control terminals 5, 6, 12 and 13 of a quad bilateral switch 60 in FIG. 4c for gating the data from the microprocessor output port to the display. This quad bilateral switch effectively has four control terminals for gating respective ones of four inputs to four outputs. That is, it has four individual switches as the name quad implies and is of the 4016 type as indicated thereon. The four conductors of data bus 62 extending therefrom are normally held at high by voltage Vcc through four pull-up resistors PUR1, respectively, which is the off state of the data bus. When a $\overline{Q3}$ output pulse is applied from counter 55 to controls 13, 5, 6 and 12 of quad switch 60, data bits at inputs 1, 4, 8 and 11 are switched through to outputs 2, 3, 9 and 10, respectively, and to data bus 62. For example, if the number 6 (binary 0110) is being clocked to the data bus, outputs 2 and 10 of switch 60 go low and outputs 3 and 9 remain high.

This data which has a voltage level of 0–5 volts is applied from data bus 62 through a voltage level shifter 64 in FIG. 4c because the display logic operates at a higher voltage of 9 volts. This voltage level shifter may be a National Semiconductor Company LM-339 type and has four voltage comparators CM1, CM2, CM3 and CM4. The negative inputs of these comparators are biased to one-half of voltage Vcc or 2.5 volts from the junction between a pair of like resistors R13 and R14 in series between voltage Vcc and ground whereas the 4-bit data code is applied to the positive inputs thereof. Since the outputs of these comparators are connected through pull-up resistors PUR2 to 9 volts, these comparators will pass the 4-bit code while shifting the 1-bits from 5 volts to 9 volts.

This code is next applied to a type 4514 4-bit strobed latch and 4-to-16 decoder 66. Only twelve of the sixteen outputs of this decoder are used, the remaining four being not connected (NC) to provide for decimal digits 0-9 plus a decimal point code and a display blanking code. These twelve outputs S0-S11 are applied to the control terminals of three quad bilateral switches 68, 70 and 72 of the 4016 type. These switches function like switch 60 hereinbefore described such that a 1-bit at a control terminal such as 13, for example, will cause the associated input and output terminals 1 and 2 to be connected. It will be apparent in FIG. 4c that these input/output terminals of the three quad bilateral switches are wired through a connector 74 to the inputs of display 6 in such a way as to cause a display of the decimal digits 0-9, a period, and a blank display in response to various input codes. This display is the 6-digit display 6 shown in FIG. 1 having connecting wires 6c.

Referring to the lower portion of FIG. 4b, the output of Schmitt trigger circuit ST1 is connected to a power loss detector PLD. The 60 Hz timing pulses at the output of Schmitt trigger circuit ST1 charge capacitor C7 rapidly through unidirectional diode D6 to keep the output of inverter 76 "high" and this "high" is applied through conductor 78 to external flag input $\overline{EF2}$ of microprocessor 18 to keep this flag normally "high". The "low" at the output of leading inverter 80 is applied to the reset terminal R of counter 55 which requires a "high" reset signal to clear the counter to an all 0 condition.

If power fails, this of course stops the timing pulses that have kept capacitor C7 charged and this capacitor discharges through resistor R15 which together provide about a one-tenth second time delay. This time delay avoids power loss detection on transients or the like shorter than that. Following this time delay, the output of inverter 76 goes "low" and this "low" is applied to external flag input $\overline{EF2}$ of the microprocessor. As a result, the microprocessor, which is programmed to test the status of this flag at the beginning of each execute cycle of the main program as shown in FIG. 16a, senses the power fail signal and calls up the power fail subroutine hereinafter described in connection with the flow chart shown in FIG. 13. In this power fail subroutine, the microprocessor substitutes its crystal controlled clock for the 60 Hz timing pulses obtained normally from the power line. This substitute clock is controlled by crystal 83 having a resistor R16 connected in parallel therewith and these two connected to clock terminal CLK and crystal terminal $\overline{XTAL}$ of the microprocessor as shown in FIG. 4b.

This power loss detector PLD also applies a high to reset terminal R of divide-by-six counter 55 to reset this counter to all 0's.

The remaining functions performed as a result of the power loss detection will be described in connection with the power fail subroutine shown in FIG. 13.

As shown in FIG. 4b, microprocessor 18 has memory address terminals MA0-MA7 connected through a memory address bus MAB to a plural-chip random access memory RAM. In this embodiment twelve RCA type 1822 256X4 RAM chips where used in pairs to provide six pages of memory, each having 256 locations of 8-bit bytes. As shown in FIG. 4b, when this memory is addressed over bus MAB, data may be transferred among the memory, the microprocessor and the I/O (input-output) devices such as output port 82, the latter being under the control of a binary-to-octal decoder 84. The output port is an RCA 1852 type and the decoder is a 4028 type. Data coming to this output port is then sent over 4-bit data bus 86 to the display as hereinbefore described. Only four bits or only a 4-bit code is required for the data to be displayed as it will carry codes for decimal numbers 0-9, the code for a period, and a display blanking code which may be any selected code higher than 9, if desired.

Figure 7:
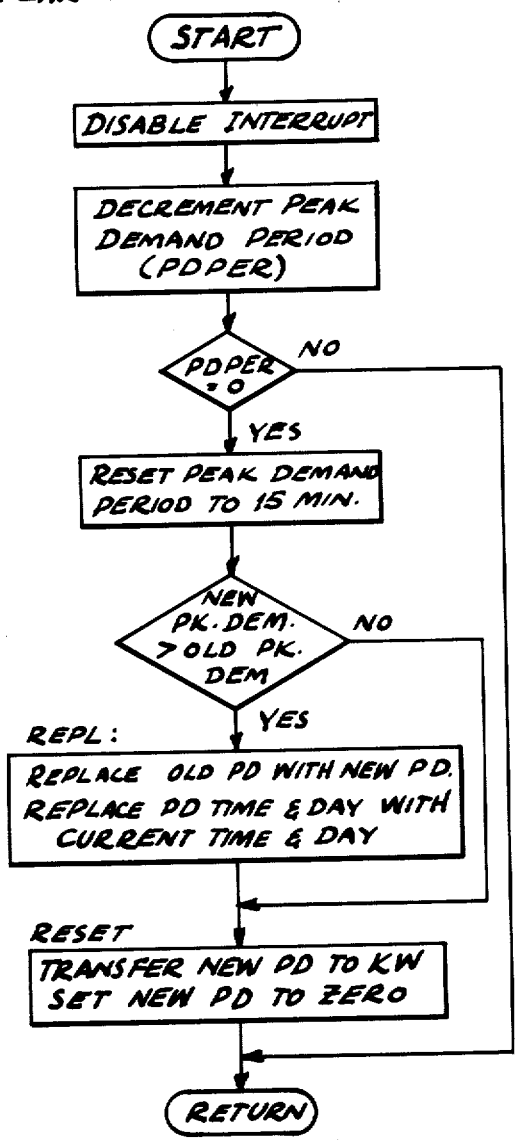
FIG. 7 is a flow chart of a peak demand subroutine used in the main program routine flow chart of FIGS. 16a-b.
Figure 8:
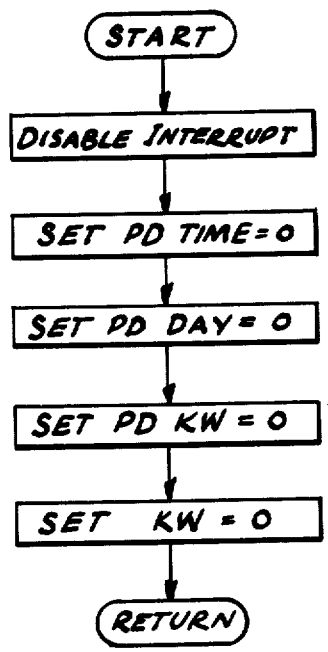
FIG. 8 is a flow chart of a peak demand reset subroutine used in the main program routine flow chart of FIGS. 16a-b.
Figure 9:
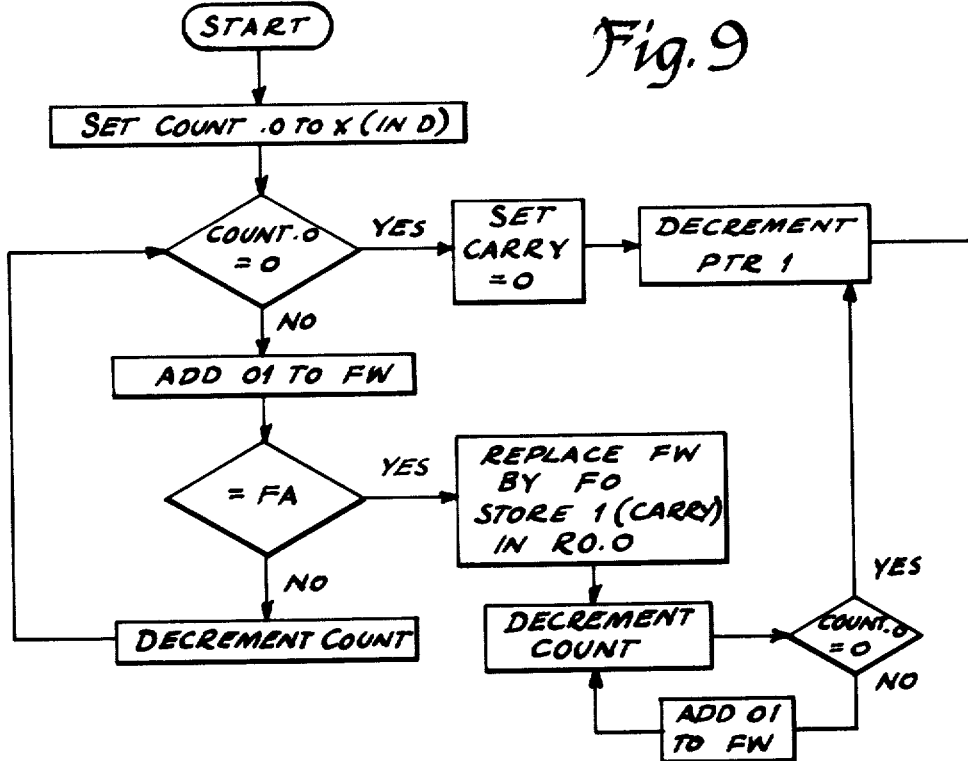
FIG. 9 is a flow chart of an arithmetical carry subsubroutine used in the add subroutine flow charts of FIGS. 10 and 11.
Figure 10:
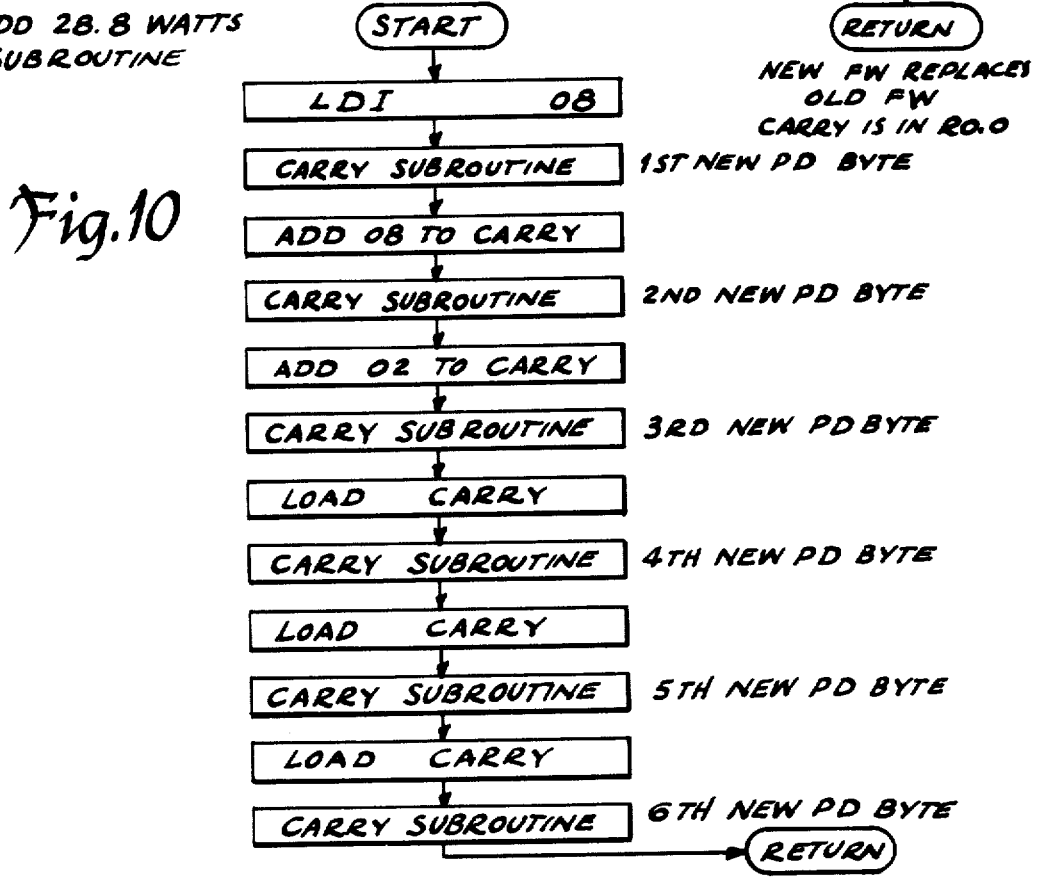
FIG. 10 is a flow chart of an arithmetical add 28.8 watts in peak demand period subroutine used in the interrupt routine flow chart of FIG. 12.
Figure 11:
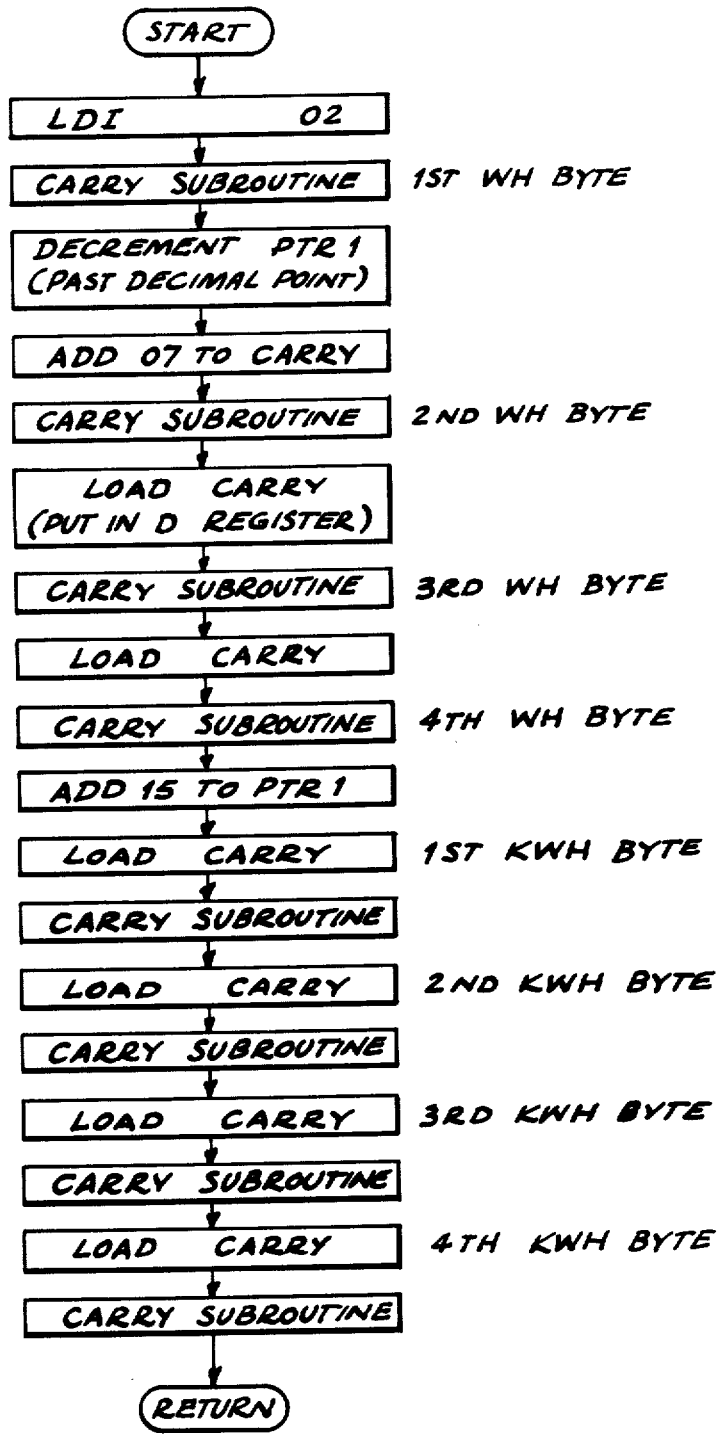
FIG. 11 is a flow chart of an arithmetical add 7.2 watthours subroutine used in the interrupt routine flow chart of FIG. 12.

The flow diagrams shown in FIGS. 6 through 15, 16a and 16b generally show the function of the system of FIGS. 1-4. These flow charts illustrate two routines and a plurality of subroutines. The two routines are the main program routine shown in FIGS. 16a and 16b and the interrupt routine shown in FIG. 12. The subroutines shown in FIGS. 6, 7, 8, 13, 14 and 15 are used in the main program routine of FIGS. 16a-b. The subroutines shown in FIGS. 10 and 11 are used in the interrupt routine of FIG. 12. And the sub-subroutine shown in FIG. 9 is used in the subroutines of FIGS. 10 and 11.

Figure 6:
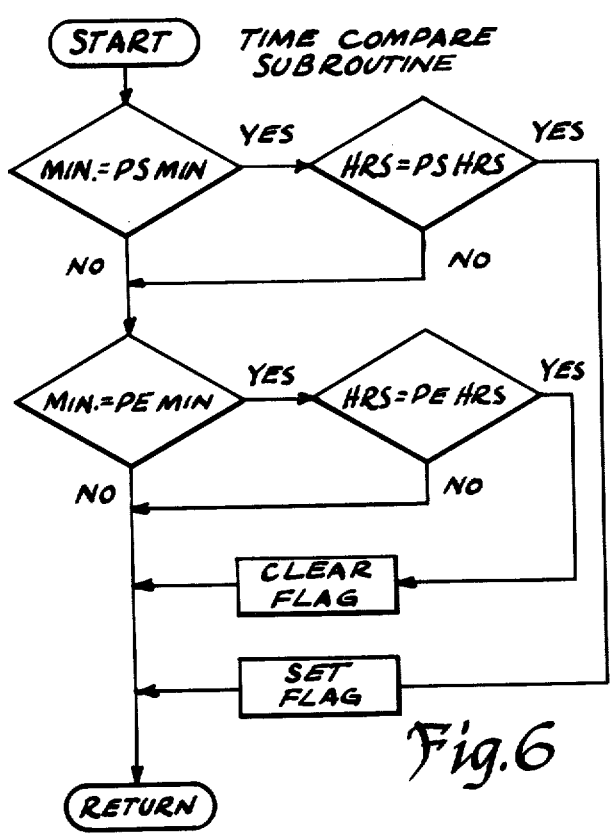
FIG. 6 shows a flow chart of a time compare subroutine used in the main program routine flow chart of FIGS. 16a–b.

Referring to FIG. 6, there is shown a time compare subroutine that is used in the main program routine as shown at the lower right-hand portion of FIG. 16a. As shown therein, this subroutine is called once each minute, that is, after the main program routine has incremented the time of day by one minute. The purpose of this time compare subroutine is to set a flag that is indicative that present time is within the predetermined peak interval. This flag then controls the microprocessor in its registration of the power usage during this peak interval in the memory. As shown in FIG. 6, when this subroutine is called by the main program after each minute, a start is effected whereafter the minutes designation is checked to determine whether it equals the peak interval start minutes or peak start minutes (PS MIN) as shown in FIG. 6. Assuming that the peak start time has been set at 1610 on a 24-hour clock, it will check to see if the current minutes matches 10. If it does, it will next check to see if the current hours matches 16, the peak start hours. If it does, it will set the flag as shown in FIG. 6.

If the current time does not match both the peak start minutes and the peak start hours, the microprocessor will then check whether the current minutes matches the peak interval end (1725, for example) minutes (25). If it does, the next step is to check the peak interval end hours (17) for a match against the current hour. If it does, the flag will be cleared as shown in FIG. 6. If the current time does not match both the peak end minutes and the peak end hours, this flow diagram indicates that the subroutine will return and wait for the next increment by one minute whereupon this subroutine will be processed again under the control of the main program.

Figure 16B:
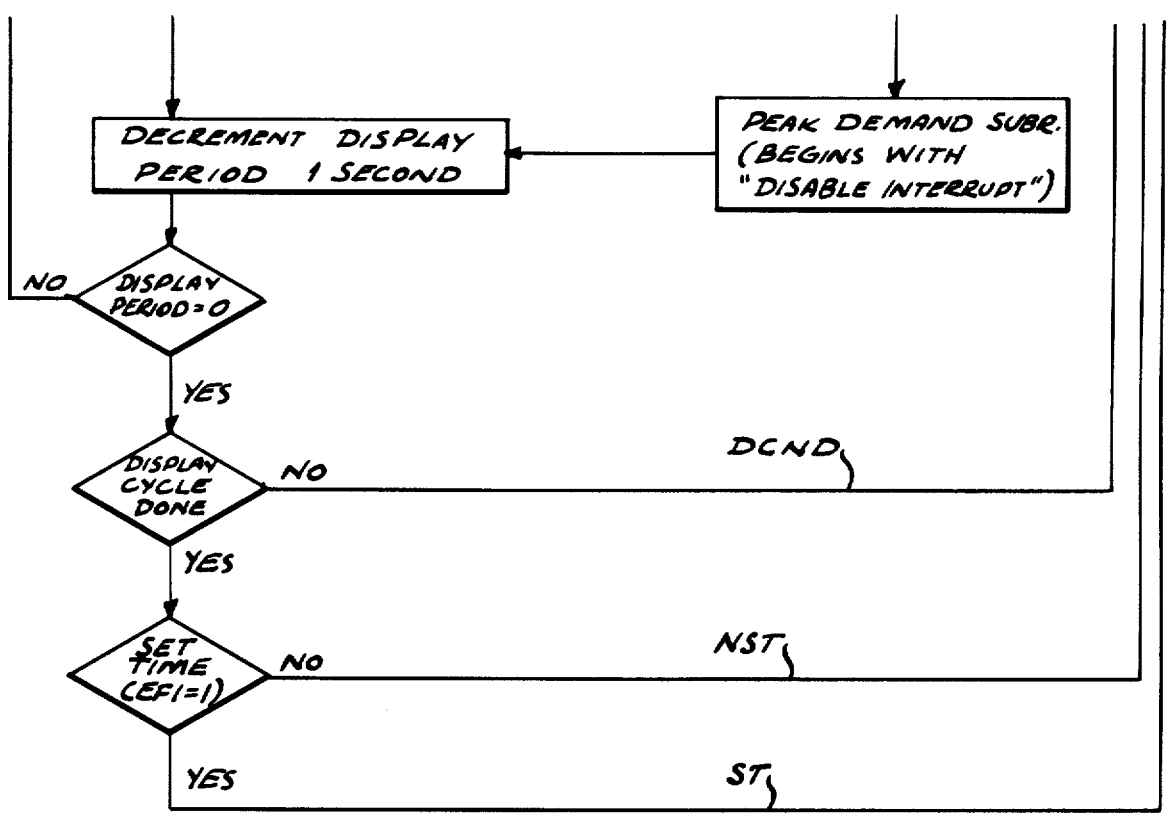

The peak demand subroutine shown in FIG. 7 is used in the main program routine flow chart as shown at the top of FIG. 16b. Assuming that the peak demand period has been set at 15 minutes, it will be apparent that the microprocessor will calculate the demand over the first 15 minute period and save it in an "old peak demand" register in the memory. A "new peak demand" period of 15 minutes will then be started and this will repeat every 15 minutes.

Referring to the bottom of FIG. 16a and the top of FIG. 16b, it will be apparent that this peak demand subroutine of FIG. 7 will be called by the main program routine after each minute of time passage. The purpose of this peak demand subroutine is to determine when the end of the 15 minute period occurs and to register the new peak demand if it is larger than the old one and also to register the day and time when this larger new peak demand occurred. Moreover, the processor will transfer the new peak demand, whether larger or smaller than the old peak demand, to the current demand register in the memory to allow display of the present demand. After the new peak demand has replaced the smaller old peak demand, the new peak demand register is set to zero and the peak demand period is reset to another 15 minutes.

More specifically, and referring to FIG. 7, it will be seen that when the peak demand subroutine is called, it will start and will first disable the interrupt. It will be recalled from the foregoing that an interrupt signal is indicative of one revolution of the meter disc and will start the interrupt routine hereinafter described. At this point, the interrupt is disabled so that it cannot come in and interfere with the peak demand subroutine. This peak demand subroutine is so short that there is no chance of losing the interrupt even if it is here disabled and thus deferred until this peak demand subroutine has been completed, and because the interrupt signal is held in flip-flop 36 in FIG. 4b. The microprocessor has an interrupt enable flip-flop IE therewithin and the interrupt is disabled by resetting this flip-flop IE whereupon the microprocessor will ignore the interrupt signal. The main program will later enable this interrupt, that is, set flip-flop IE as hereinafter described.

Following the flow chart in FIG. 7 to the next step, the peak demand period is decremented by one minute and is then checked to see if it is zero, that is, if the peak demand period of 15 minutes is at its end. If not, the subroutine will return to the main program. On the other hand, if the peak demand period is equal to zero, the peak demand period is reset to 15 minutes, and a check is made to see if the new peak demand is larger than the old peak demand. If not, the old peak demand as well as its day and time remains registered and displayed. The subroutine then branches down to a reset function, that is, the new peak demand must nevertheless be transferred to the KW, meaning the current demand (present demand) register, and the new peak demand register in the memory is reset to zero.

On the other hand, if the new peak demand was found to be larger than the old peak demand in the prior decision step, a replace function is performed, that is, the old peak demand is replaced by the new peak demand in the memory register so as to always have the largest peak demand available for display, and the old peak demand day and time is replaced by the new peak demand day and time so that the display will show when it occurred. The subroutine will then continue with the aforementioned reset function and will return to the main program.

Alternatively, sliding or partially overlapping peak demand periods could be used. For example, the first peak demand period could be 1:00 to 1:15, the second from 1:05 to 1:20, the third from 1:10 to 1:25, the fourth from 1:15 to 1:30, etc. Then the demand for the period ending at 1:20 would be compared with the demand for the period ending at 1:15, etc. This can be done with a suitable change in the program that can be made by a computer programmer.

The peak demand reset subroutine shown in the flow chart of FIG. 8 is called by the main program as shown in FIG. 16a when peak demand reset switch PDR in FIG. 4a has been pressed. The purpose of this subroutine is to reset the peak demand time and day to zero, and to reset the peak demand kilowatts register in the memory to zero. This peak demand KW register is the old peak demand register referred to in connection with FIG. 7 that is displayed. Also, this subroutine sets the KW to zero, that is, sets the current demand register in the memory to zero. Then the subroutine returns to continue the main program.

The carry sub-subroutine shown in FIG. 9 is merely a mathematical procedure to handle the carries when hexadecimal numbers that are used in the microprocessor are being added. This carry sub-subroutine of FIG. 9 is used several times in both the add 28.8 watts subroutine of FIG. 10 and the add 7.2 watts subroutine of FIG. 11.

Considering FIG. 11 first, one revolution of the meter disc represents energy usage of 7.2 watthours. Therefore, in FIG. 10 where the peak demand period is 15 minutes, that is, one-fourth of an hour, one revolution of the disc during this 15 minute period corresponds to four revolutions per hour which represents an energy use rate of 28.8 watthours per hour or 28.8 watts of power. It will, therefore, be seen that whenever a disc revolution is detected, it will be necessary to add 7.2 watthours to the register in the memory that is holding the total kilowatthour data and to add 28.8 watts to the register in the memory that has been assigned to hold the new peak demand data as hereinbefore described in connection with FIG. 7. And if this disc revolution detection took place during the predetermined peak interval, it is also necessary to add 7.2 watthours to the peak interval KWH register in the memory that is holding the energy used during the peak interval since normally there will be a higher rate of charge for that. It will be recalled that the peak interval is the programmed or preset time interval such as the aforementioned 1610 to 1725 daily interval on a 24-hour clock where experience has shown energy usage to be the highest whereas the peak demand period is 15 minutes and repeats every 15 minutes.

Figure 12:
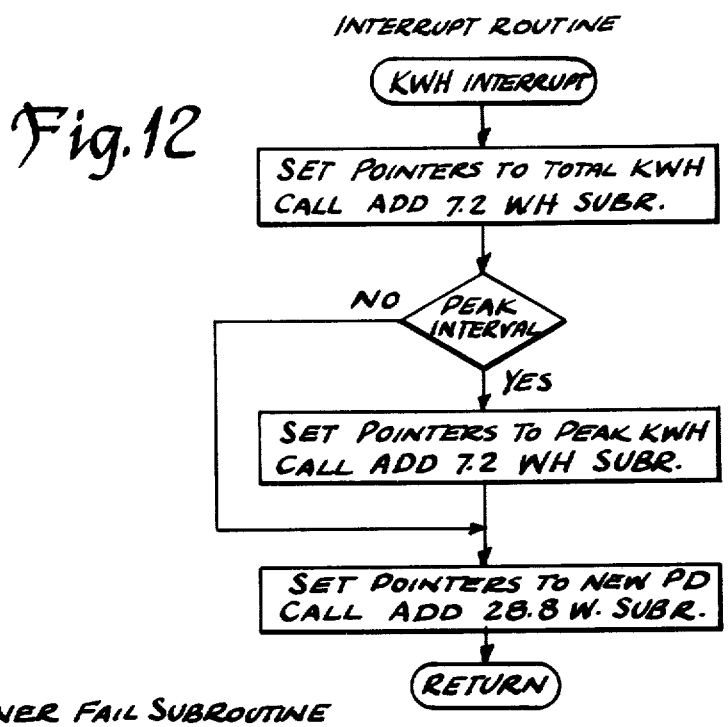
FIG. 12 is a flow-chart of an interrupt routine that is initiated each time one revolution of the meter disc is sensed.

As shown in the interrupt routine flow chart of FIG. 12, when a disc revolution is detected by the optical pickup, a KWH interrupt occurs. Then the register pointers are set to the total KWH and the add 7.2 WH subroutine of FIG. 11 is called. As hereinbefore mentioned and shown in FIG. 11, this subroutine performs the mathematical function of adding 7.2 WH to the registers in the memory holding the total watthours and total KWH, items 3 and 4 on the above list of data to be displayed. This sub-routine periodically calls the carry sub-subroutine of FIG. 9 as the hexadecimal bytes are processed to add first the watthour digits and then the kilowatthour digits. It will be recalled that when the watthour register reaches 1,000 it is reset to zero and the KWH register is incremented so that both registers must be displayed for a correct total reading.

Referring again to FIG. 12, next a decision is made as to whether the time is in the peak interval. If not, it branches to set the pointers to the new peak demand. The add 28.8 watts subroutine of FIG. 10 is then called and this figure is added to the new peak demand register in the memory so that it can be compared to the old peak demand as shown in FIG. 7. After this has been done, the interrupt subroutine of FIG. 12 returns to allow the main program to continue from the point where it was interrupted.

On the other hand, if in FIG. 12 the peak interval decision indicated "yes", the pointers are set to the peak KWH since now 7.2 WH must be added to the registers holding the peak interval watthours and kilowatthours. For this purpose, the interrupt routine calls the add 7.2 WH subroutine of FIG. 11 to perform the addition hereinbefore described. The interrupt routine then continues with adding 28.8 watts to the new peak demand registers and returns the control to the main program. The peak interval is programmed as shown by the ROM data in the program hereinafter appearing. It will, therefore, be apparent that more than one peak interval per day or different peak intervals on different days may readily be provided by suitable change in the program that can be done by a computer programmer.

Figure 13:
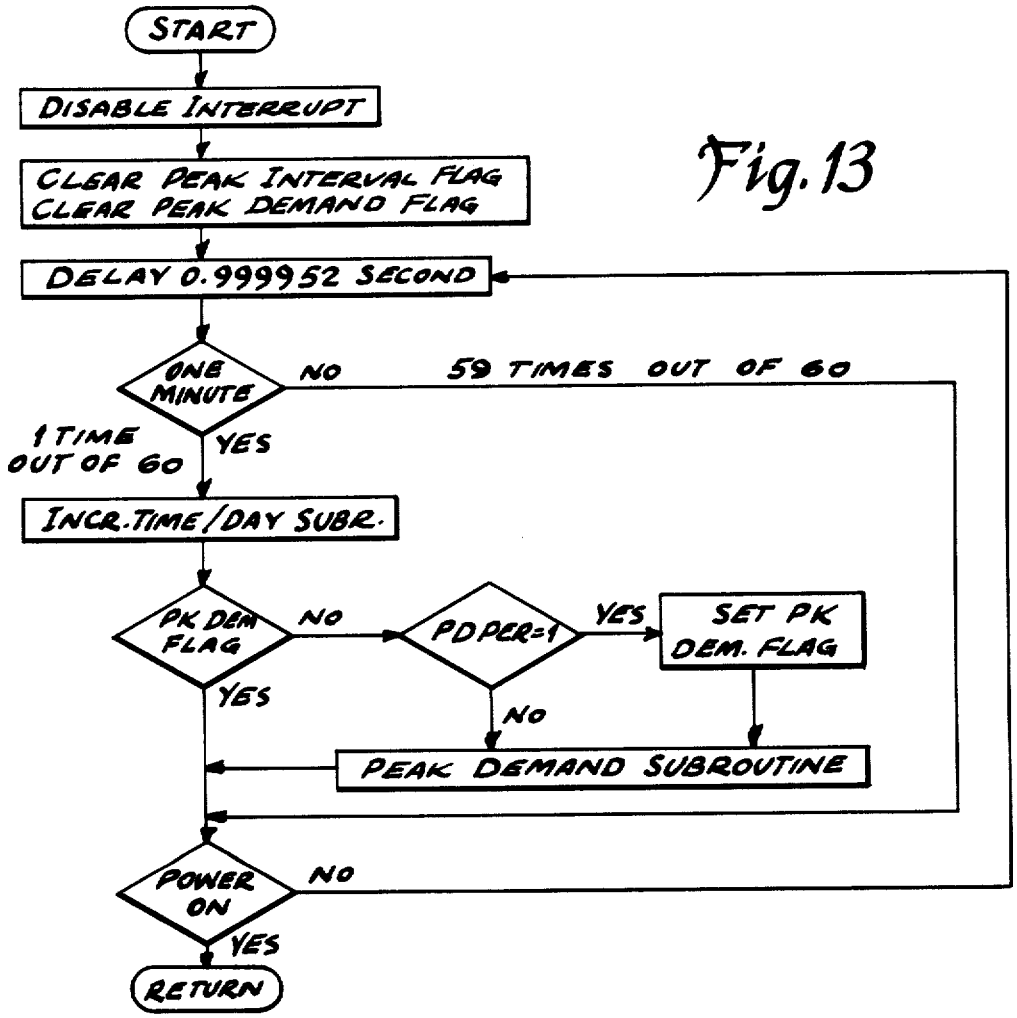
FIG. 13 is a flow chart of a power fail subroutine used in the main program routine flow chart of FIGS. 16a-b.

The power fail subroutine shown in FIG. 13 is provided for the purpose of transferring from the 60 Hz power line timing clock pulses, which now have failed, to the microprocessor standby oscillator provided by crystal 83 shown at the top of FIG. 4b so that time keeping will continue uninterrupted during the time that the power is off. In addition, this subroutine continues counting the remainder of the then-occurring 15 minute peak demand period whereafter servicing of peak demand will be discontinued in order to begin with a complete 15 minute period when power is restored.

For this purpose, when the power fail subroutine of FIG. 13 is called by the main program as shown in FIG. 16a, it will start and initially will disable the interrupt. This will prevent the optical pickup pulse from interrupting the microprocessor should the power come back on in the meantime. Next this power fail subroutine will clear the peak interval flag if it happened to be set at the time of power failure. It will be recalled that the peak interval flag was set by the time compare subroutine of FIG. 6 as hereinbefore described. Of course, if the power failure occurs outside the peak interval, this clearing action has no effect since the peak interval flag has already been cleared at the end of the previous peak interval as shown in FIG. 6. This peak interval flag is a single bit appearing in the least significant bit (LSB) location of the high byte (1 byte) in the R9 register of the microprocessor as indicated under Register Assignments hereinafter appearing.

Next the peak demand flag is cleared. The manner of setting and the purpose of this peak demand flag is described later in this same subroutine.

Next the power fail subroutine will count a one second time delay, as close to one second as is possible by counting machine cycles of certain loops of the program of the microprocessor, and will then check to see if one minute has passed. If not, the program will branch down in FIG. 13 and check if the power came back on. If not, it will branch back up and count another second delay and check again for one minute. This one minute check will be "no" 59 times out of 60 and "yes" 1 time out of 60. Thus, when one minute has been counted, this subroutine will call the increment time/day 1 minute subroutine of FIG. 14 hereinafter described. Then the peak demand flag will be tested and the result will be "no" since it was cleared earlier in this same subroutine. Then the subroutine will check to see if the peak demand period (PDPER) has been decremented from 15 to 1. Assume that the power failed 5 minutes into the 15 minute peak demand period. Then the peak demand subroutine of FIG. 7 is called which decrements the peak demand period by one among other things hereinbefore described. Then power on is checked and if not on, this subroutine branches back for another one second time delay count. This loop is processed nine times or until the peak demand period is down to one whereupon the peak demand flag is set as shown in FIG. 13. Then the peak demand subroutine is called once more to complete the peak demand period processing.

Power being still off, on the next loop of this subroutine, when the peak demand flag is checked, it will be "yes" and the peak demand subroutine will be bypassed. Then the power will be checked and if not on, it will branch back for another minute count. This loop will now occur repeatedly incrementing the time one minute each time to keep time until the power comes back on. Then this subroutine will return to the main program routine of FIG. 16a-b.

Figure 14:
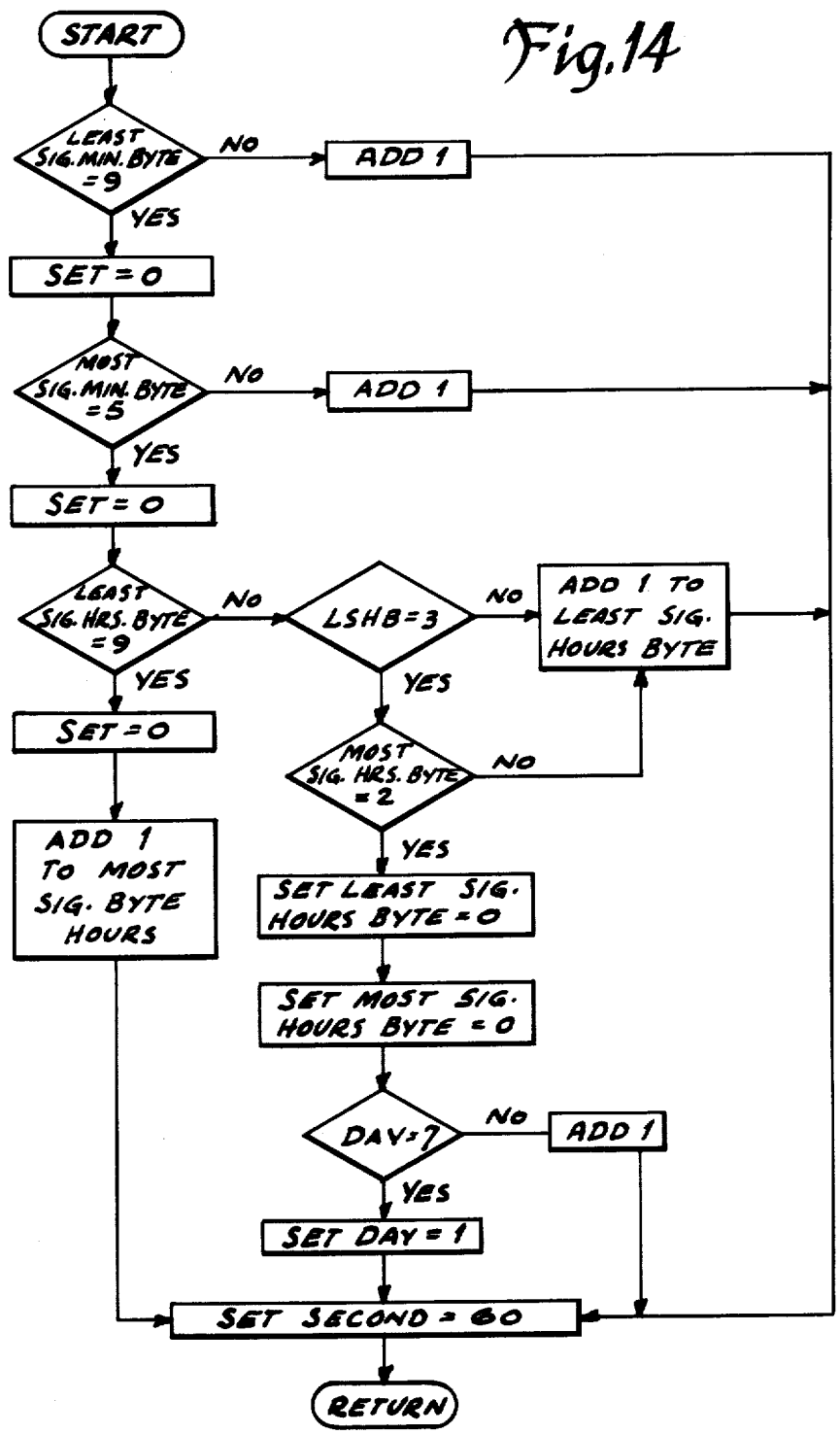
FIG. 14 is a flow chart of an increment time/day one minute subroutine used in the main program routine flow chart of FIGS. 16a-b.

The increment time/day 1 minute subroutine shown in the flow chart of FIG. 14 is used in the main program routine (also known as display routine) as shown at the bottom of FIG. 16a and is also used in the power fail subroutine of FIG. 13. As will be apparent, in the main program this increment time/day 1 minute subroutine is used to keep time when the 60 Hz pulses are being received from the power line and in the power fail subroutine, this increment time/day 1 minute subroutine is used to keep time when timing pulses are received from the internal crystal oscillator.

As shown in FIG. 14, when this increment time/day 1 minute subroutine is called, it is started and a comparison is made to determine if the least significant minute byte is equal to 9, leading to the counting of 59 minutes approaching one hour. If not, the program adds one thereto, branches down and sets the seconds registration to 60 so that the next seconds count will start from one. This subroutine then returns to the point where it was called.

This loop is processed once each minute until the least significant minutes byte equals 9. This byte is then set to zero as shown in FIG. 14 and the most significant minutes byte is checked to see if it equals 5. If not, the subroutine adds one thereto, sets seconds to 60 as before and returns. This loop repeats until the most significant minutes byte equals 5 whereupon it is reset to zero.

Next the least significant hours byte is checked to see if it equals 9, that is, having reached 9 or 19 in a 24-hour day. If not, this byte is then checked if it has reached 3 approaching the end of the day. If not, the hours is incremented by adding one to that byte, the seconds is set to 60 and the subroutine returns. This loop is processed until the least significant hours byte reaches 3. Then the most significant hours byte is checked for equality to 2. If not, then the least significant hours byte will be incremented, seconds set to 60 and the subroutine returns. That was 3 hours into the 24-hour day.

At 9 hours into the 24-hour day, the least significant hours byte will equal 9, will be reset to zero and one will be added to the most significant hours byte. These loops will then be repeated in order past 19 to 20 and on to 23. This will cause the LSHB check to equal 3 whereupon the most significant hours byte will be checked for equality to 2 whereupon the center path in FIG. 14 will be followed. The LSHB will be set to zero, the MSHB will be set to zero and the day will be checked to see if it equals 7. If not, one is added thereto, the seconds registration is set to 60 and the subroutine returns. This loop is repeated until the day reading equals 7 whereupon it is reset to one, the seconds is set to 60 and the subroutine returns. As shown in FIGS. 13 and 16a, this subroutine is called once each minute and executes in the aforementioned manner to increment the time and the day and to repeat likewise.

Figure 15:
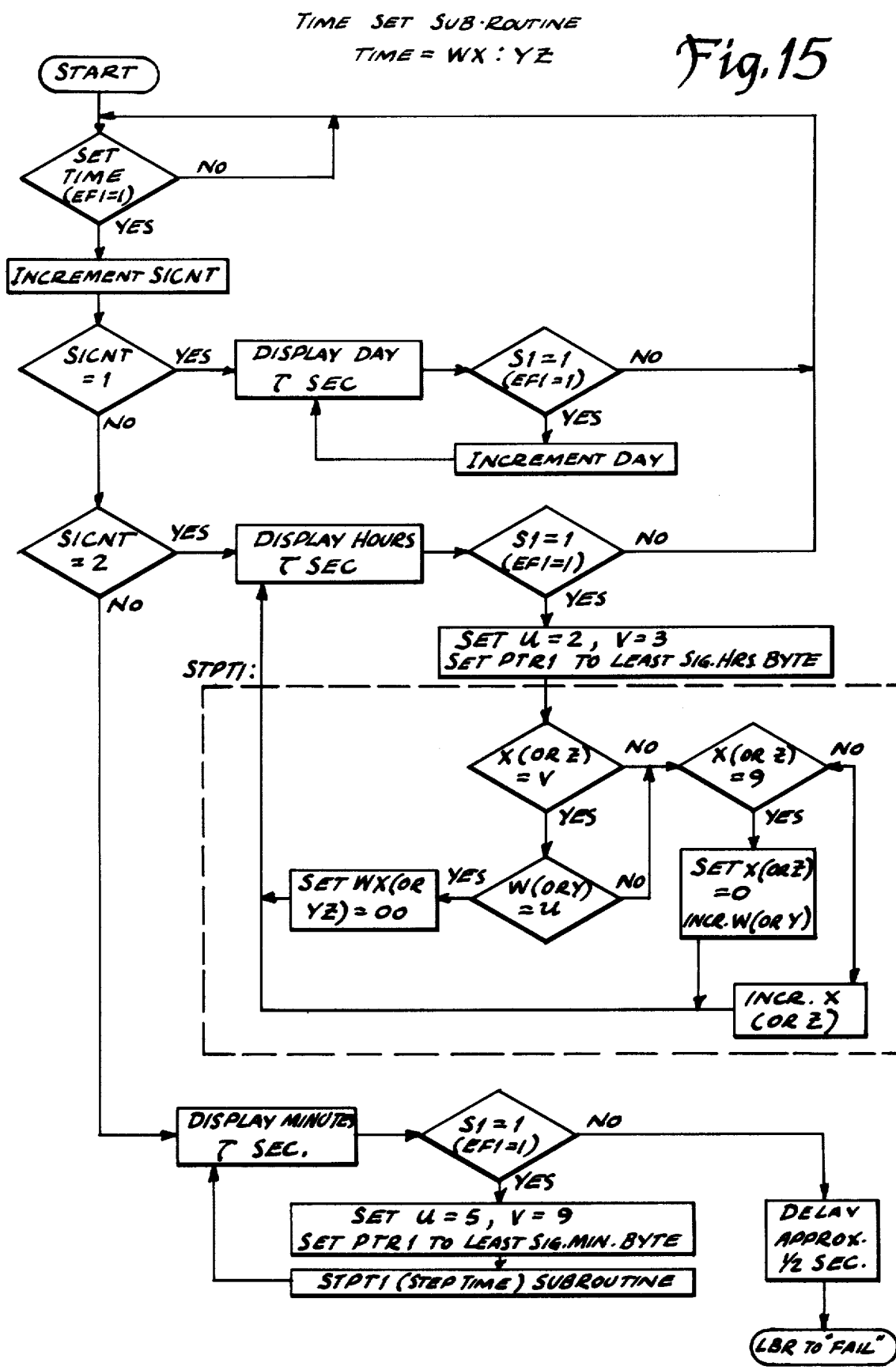
FIG. 15 is a flow chart of a time set subroutine used in the main program routine flow chart of FIGS. 16a-b.

The time set subroutine shown in the flow chart of FIG. 15 is called near the beginning of the main program routine in FIG. 16a on each execution of the main program. When this time set routine is called, it is started as shown in FIG. 15 and external flag EF1 is checked to see if it is "on" or "1". If the time set pushbutton TS in FIG. 4a has not been pressed, the time set subroutine will be released back to start. On the other hand, if this pushbutton has been pressed, it will increment the S1 counter (S1CNT) to one.

It will be recalled that when pushbutton TS is pressed the first time and held, the S1 counter will increment to 1 and the days counter will increment from 1 to 7 and repeat. This days count will be displayed on indicator 6 within the meter. Thus the pushbutton must be released at the appropriate time to stop the days count at the desired setting. The hours and minutes are similarly set on the second and third depressions of this pushbutton time set switch TS as hereinafter more specifically described in connection with FIG. 15.

After the S1 counter is incremented to 1 as aforesaid, the time set subroutine in FIG. 15 checks to see if this S1 count equals 1. If it does, the day is displayed for a preset number (tau) of seconds. Then a check is again made to see if the external flag EF1 is still on. If not (the pushbutton has been released), the subroutine returns to start to begin a new execution. On the other hand, if the external flag is still on, the day will be incremented and displayed and this increment day loop will be repeated until the pushbutton is released whereupon it will go to start to begin a new execution cycle, the desired day having been set.

If the pushbutton is pressed a second time putting external flag EF1 on again, the time set routine will check for this flag and increment the S1 counter to 2. This subroutine will check to see if the S1 count is 1 and then check for 2. Finding that it is 2, the hours will be displayed for a preset number of seconds. Next flag EF1 will be checked to see if it is still on, and if not, the subroutine will return to start and re-execute. On the other hand, if this external flag is still on, the hours will be incremented 1 to 23, reset to zero and repeat. This is done by the step-time sub-subroutine STPT1 shown within broken lines in FIG. 15.

First the data is set up for a 24-hour day by setting the U and V bytes in a memory location or the like to 2 and 3, respectively, so as to be available to the step-time sub-subroutine to be able to display 0 to 23 hours and reset to zero and repeat as long as the pushbutton is held down. Also pointer 1 is set to the least significant hours byte X, the hours and minutes bytes being shown as WX:YZ at the top of FIG. 15.

Then the step-time sub-subroutine is called. This sub-subroutine is used twice, first for the hours and then for the minutes settings, the latter shown only as a rectangle at the bottom of FIG. 15. Therefore, the first character such as X in the legends in this step-time sub-subroutine is used for hours setting and the second character (or Z) is used later for the minutes setting.

This step-time sub-subroutine first checks to see whether the least significant hours byte (LSHB) X is equal to V which is 3. If not, it will check X against 9. If not, it will increment X and display it. It will repeat this loop, incrementing hours each time until the LSHB equals 9 whereupon it will reset it to zero and increment the most significant hours byte (MSHB) to 1, in other words, incrementing 9 to 10. This process is then repeated to 13 whereupon X matches V, or 3, and W is checked against U, or 2. Since there is no match, the previous incrementing continues through 19 to 20 and 23. This brings about matches of X to V and W to U so that WX is reset to zero and the hours display continues to roll until switch TS is released at the desired hours setting. This release of the switch causes a lack of equality of S1 to 1 after the hours display and the sub-subroutine branches back to the start.

The third time switch TS is pressed produces an S1 counter incrementing to 3. Thus, the subroutine now passes by the count checks of 1 and 2 and displays the minutes for a preset number of seconds. Then a comparison is made to see if the time-set external flag EF1 is still on. If not, it delays for about a half a second and long-branches to the next step (power fail check) in the main program in FIG. 16a.

On the other hand, if the switch is still pressed, U and V data are set to 5 and 9, respectively, for stepping the minutes from 0 to 59 and reset to zero and repeat. Also, pointer 1 is set to the least significant minutes byte in the RAM. The step-time sub-subroutine is now called again to step the minutes 0 to 59 and repeat and to display them so that the operator can release the switch to set the minutes at the desired setting. The sub-subroutine then long-branches back to the main program as hereinbefore described.

The main (display) program routine is executed by the microprocessor repeatedly at a very fast rate, this routine being shown in FIGS. 16a-b. The microprocessor, when turned on, automatically performs a power-up reset and starts to run or execute the program as shown at the top of FIG. 16a. The first instruction of the program is to disable the interrupt because if an interrupt occurred at this premature time, the microprocessor wouldn't know what to do with it. First, it is necessary to prepare the processor by initializing the RAM and pointers. Then the time set subroutine is called to enable the operator to set the day, hour and minute as hereinbefore described in connection with FIG. 15. This program then checks to see if the power has failed. If it has, the program will call up the power fail subroutine of FIG. 13. But rarely does this occur so that most of the time the program will move on to initialize the display cycle pointers, then set the display period to 3 seconds, set the display count to 10, and reset the output flag and transfer data to the buffer. This buffer is a location in the memory that holds the 10 output bytes (8 decimal bytes plus a "clear entry" byte and a decimal point byte) from where they are sent to the display. The display period is set at 3 seconds because it takes 1 second to run the data into the indicator and it is displayed for 2 additional seconds to allow time for the operator to read it. The display count is set at 10 because there are 10 timing pulses per second as hereinbefore described for time keeping and one output byte is output with each timing pulse. When the display count is decremented 10 times, the microprocessor knows that all 10 bytes of the display data have been outputted.

Next this main program checks to see if switch TS (flag $\overline{EF1}$) is on for setting the time. If it is, the program branches back up to disable the interrupt and call the time set subroutine. Most of the time, this switch is not pressed down so the program next checks to see if the peak demand reset switch PDR is down. If it is, the peak demand reset subroutine of FIG. 8 is called. If it is not, the program then enables the interrupt so that processing of KWH data can proceed, that is, sets the IE flip-flop.

So far this main program has mainly prepared the microcomputer of the time-of-day meter for operation. Now it starts to look for the time keeping pulses that are coming from the divide-by-six counter at the lower portion of FIG. 4b to external flag input $\overline{EF4}$ of the microprocessor as hereinbefore described. It will be recalled that there are ten pulses per second since the 60 Hz frequency is divided by six. Therefore, as shown in FIG. 16a, the program looks for 0.1 second, that is, is the EF4 external flag on. If it is not, it will branch back and check for power failure. If power has failed, it will call the power fail subroutine. If power has not failed, it will check again for the set time flag EF1 and repeat this loop until a tenth of a second pulse is sensed.

As a result of this sensing of the one-tenth second passage, the program checks for the output flag as shown in FIG. 16a. This output flag is a single bit in the microprocessor R9 register, this bit being in the penultimate LSB position of the high byte in this register as shown hereinafter under Register Assignments. The first time this main program is executed, the output flag will not be on because it has been reset earlier in this program as shown in FIG. 16a. Therefore, the program will output the first digit from the aforementioned buffer in the memory to the display. Then the program will check for external flag EF4 again and will re-check until the 0.1 second pulse terminates dropping flag EF4. This will cause the program to decrement the display count which had previously been set at 10.

Next the main program checks for one second, that is, a display count of zero. The "no" causes the program to branch back for a power fail check and to repeat this loop, transferring a digit from the buffer to the display each time and decrementing the display counts until all the data is on display and the display count is zero, that is, one second has passed. Thus it will be seen that it took one second from the 3 second display period previously set to transfer the data to the display. The data will now be displayed for two more seconds to afford time for the operator to see and read it.

Next the main program sets the display count to 10 again and sets the output flag. It will be apparent from inspecting the part of the flow chart just described that this output flag being in set state will cause the program when it comes around this loop again to skip outputting of 1 digit but will decrement the display count, etc. This allows the data to remain on the display for two more seconds as hereinafter described.

After the output flag is set as hereinbefore described, the program checks for one minute, lower left-hand portion of FIG. 16a. Since only one second has passed, the program then decrements the display period one second from 3 to 2 and checks if the display period is down to zero. Since it is not, the program branches back to check power failure and repeats this loop.

At the end of the second second, the display count is again set to 10. Also the output flag is set but has no effect since it was set previously. And the display period is decremented one second from 2 to 1.

At the end of the third second, the display period is decremented from 1 to 0, upper left-hand portion of FIG. 16b. Then the program checks to see if the display period equals zero and since it does, it checks to see if the display cycle is done. It is not since there are a total of 12 sets of data to be displayed. Therefore the program branches back along display-cycle-not-done line DCND to set another 3 second display period and the main program is executed to display the succeeding set of data in the above list of 12 sets of data. This display process is repeated until all twelve sets of data have been displayed. Then the program checks to see if the display cycle is done and finding it done, continues the program and checks to see if someone is pushing the set time button, that is, if external flag EF1 is on. If not, the program branches along not-set-time line NST back to initialize the display cycle pointers and thus start another display cycle of the 12 sets of data. On the other hand, if the set-time external flag is on, the program will branch along set-time line ST back to disable the interrupt and call the time set subroutine and then continue with another display cycle.

Going back to the lower portion of FIG. 12a, the program checks for one minute after the passage of each second in the display periods. When one minute has passed, the program calls the increment time/day by 1 minute subroutine to keep track of time as hereinbefore described. It will be apparent that the main program counts the ten timing pulses per second in a display counter and counts the seconds up to 60 in a seconds counter. When this seconds counter reaches 60, the aforesaid one minute check is positive, and the increment time/day 1 minute subroutine of FIG. 14 is then called as shown at the bottom of FIG. 16a.

Next, the program calls the time compare subroutine of FIG. 6 to check for the peak demand interval as hereinbefore described. Next, the program calls the peak demand period subroutine of FIG. 7 as shown at the top of FIG. 16b to process the peak demand data as hereinbefore described. The main program then decrements the display period one second and continues the program as hereinbefore described.

While the apparatus hereinbefore described and further disclosed in the following microprocessor program for time-of-day meter is effectively adapted to fulfill the objects stated, it is to be understood that this invention is not intended to be confined to the particular preferred embodiment of digital processing system for time-of-day meter display disclosed, inasmuch as it is susceptible of various modifications without departing from the scope of the appended claims.

The program appended hereto uses the RCA CDP1802 COSMAC Microprocessor Instruction Set.

KWH-KW Meter -- PROGRAM (15 Min. Peak Demand, LCD Display)

Initialization (61 Bytes)

```
0000 -------- 71   DIS
              00
              F8   LDI
              7E
```

```
                     AF    PLO    ROMPT
                     F8    LDI
                     04
                     BF    PHI    ROMPT
                     EF    SEX    ROMPT
                     72    LDXA
                     A1    PLO    R1
                     72    LDXA
                     A2    PLO    R2
                     72    LDXA
                     A3    PLO    R3
                     72    LDXA
0010 --------        A4    PLO    R4
                     72    LDXA
                     A5    PLO    R5
                     72    LDXA
                     A7    PLO    R7
                     72    LDXA
                     A9    PLO    R9
                     72    LDXA
                     AA    PLO    RA
                     72    LDXA
                     AB    PLO    RB
                     72    LDXA
                     AD    PLO    RD
                     72    LDXA
                     B1    PHI    R1
                     72    LDXA
0020 --------        B2    PHI    R2
                     72    LDXA
                     B3    PHI    R3
                     72    LDXA
                     B4    PHI    R4
                     72    LDXA
                     B5    PHI    R5
                     72    LDXA
                     B7    PHI    R7
                     72    LDXA
                     B8    PHI    R8
                     72    LDXA
                     BA    PHI    RA
                     F8    LDI                      First "DAY" address.
                     00
002F --------        AF    PLO    ROMPT
0030  INITL:         72    LDXA
                     57    STR    PTR 1
                     17    INC    PTR 1
                     2D    DEC    COUNT
                     8E    GLO    COUNT
                     3A    BNZ           INITL
                     30
                     D3    SEP    R3
                     F8    LDI
                     00
                     A0    PLO    R0
                     30    BR            RS1
003C --------        40
```

Time Set Routine (104 Bytes)

```
0040  RS1:           F8    LDI
                     00
                     AE    PLO    S1CNT
                     B9    PHI    FLAGS
0044  SET?:          3C    BN1           SET?
                     44
0046  SET:           1E    INC    S1CNT
                     8E    GLO    S1CNT
                     FF    SMI
```

|      |       | 01 |      |       |                              |
|------|-------|----|------|-------|------------------------------|
|      |       | 32 | BZ   | SDAY  |                              |
|      |       | 77 |      |       |                              |
|      |       | FF | SMI  |       |                              |
|      |       | 01 |      |       |                              |
|      |       | 32 | BZ   | SHRS  |                              |
|      |       | 94 |      |       |                              |
| 0050 | SMIN: | F8 | LDI  |       | Least sig. min. byte.        |
|      |       | 12 |      |       |                              |
|      |       | A7 | PLO  | PTR 1 |                              |
|      |       | D4 | SEP  | R4    | Call Time Set Output subr.   |
|      |       | 00 |      |       |                              |
|      |       | C8 |      |       |                              |
|      |       | 34 | B1   | CONT  |                              |
|      |       | 6D |      |       |                              |
|      |       | F8 | LDI  |       | Apprx. ½ second delay.       |
|      |       | 80 |      |       |                              |
|      |       | BD | PHI  | COUNT |                              |
| 005B | L1:   | F8 | LDI  |       |                              |
|      |       | FF |      |       |                              |
|      |       | AD | PLO  | COUNT |                              |
| 005E | L2:   | FF | SMI  |       |                              |
|      |       | 01 |      |       |                              |
| 0060 |       | 3A | BNZ  | L2    |                              |
|      |       | 5E |      |       |                              |
|      |       | 34 | B1   | RS1   |                              |
|      |       | 40 |      |       |                              |
|      |       | 9D | GHI  | COUNT |                              |
|      |       | FF | SMI  |       |                              |
|      |       | 01 |      |       |                              |
|      |       | BD | PHI  | COUNT |                              |
|      |       | 3A | BNZ  | L1    |                              |
|      |       | 5B |      |       |                              |
|      |       | C0 | LBR  | FAIL? |                              |
|      |       | 01 |      |       |                              |
|      |       | 00 |      |       |                              |
| 006D | CONT: | F8 | LDI  |       | Least sig. min. byte.        |
|      |       | 12 |      |       |                              |
|      |       | A7 | PLO  | PTR 1 |                              |
| 0070 |       | D4 | SEP  | R4    | Call STPTI subr.             |
|      |       | 00 |      |       | Address                      |
|      |       | A8 |      |       | "                            |
|      |       | F9 |      |       | Data for STPTI subr.         |
|      |       | F5 |      |       | "    "    "    "             |
|      |       | 30 | BR   | SMIN  |                              |
| 0076 |       | 50 |      |       |                              |
| 0077 | SDAY: | F8 | LDI  |       | Next-to-last "DAY" address.  |
|      |       | 08 |      |       |                              |
|      |       | A7 | PLO  | PTR 1 |                              |
|      |       | D4 | SEP  | R4    | Call Time Set Output subr.   |
|      |       | 00 |      |       |                              |
|      |       | C8 |      |       |                              |
|      |       | 30 | BR   | MORE  |                              |
|      |       | 81 |      |       |                              |
|      |       | 30 | BR   | SET?  |                              |
| 0080 |       | 44 |      |       |                              |
| 0081 | MORE: | F8 | LDI  |       | Next-to-last "DAY" address.  |
|      |       | 08 |      |       |                              |
|      |       | A7 | PLO  | PTR 1 |                              |
|      |       | 07 | LDN  | PTR 1 |                              |
|      |       | FC | ADI  |       |                              |
|      |       | 01 |      |       |                              |
|      |       | BB | PHI  | TEMP  |                              |
|      |       | FF | SMI  |       |                              |
|      |       | F8 |      |       |                              |
|      |       | 33 | BPZ  | REDA  |                              |
|      |       | 90 |      |       |                              |
|      |       | 9B | GHI  | TEMP  |                              |

| | | | | | |
|---|---|---|---|---|---|
| 008D | STRDA: | 57 | STR | PTR 1 | |
| | | 30 | BR | | SDAY |
| | | 77 | | | |
| 0090 | REDA: | F8 | LDI | | |
| | | F1 | | | |
| | | 30 | BR | | STRDA |
| | | 8D | | | |
| 0094 | SHRS: | F8 | LDI | | Least sig. hours byte. |
| | | 10 | | | |
| | | A7 | PLO | PTR 1 | |
| | | D4 | SEP | R4 | Call Time Set Output subr. |
| | | 00 | | | |
| | | C8 | | | |
| | | 30 | BR | | CNTIN |
| | | 9E | | | |
| | | 30 | BR | | SET? |
| | | 44 | | | |
| 009E | CNTIN: | F8 | LDI | | Least sig. hours byte. |
| | | 10 | | | |
| 00A0 | | A7 | PLO | PTR 1 | |
| | | D4 | SEP | R4 | Call STPTI subr. |
| | | 00 | | | Address |
| | | A8 | | | " |
| | | F3 | | | Data for STPTI subr. |
| | | F2 | | | " " " " |
| | | 30 | BR | | SHRS |
| 00A7 | | 94 | | | |

STPTI ("Step Time") Subroutine. (32 Bytes)   SCRT   (Standard Call and Return Technique)

| | | | | | |
|---|---|---|---|---|---|
| 00A8 | | E7 | SEX | PTR 1 | |
| | | 46 | LDA | R6 | |
| | | F7 | SM | | |
| | | 3A | BNZ | | EQL9? |
| | | BB | | | |
| | | 46 | LDA | R6 | |
| | | 27 | DEC | PTR 1 | |
| | | F7 | SM | | |
| 00B0 | | 32 | BZ | | RSET |
| | | B5 | | | |
| | | 17 | INC | PTR 1 | |
| | | 30 | BR | | EQL9? |
| | | BB | | | |
| 00B5 | RSET: | F8 | LDI | | |
| | | F0 | | | |
| | | 57 | STR | PTR 1 | |
| | | 17 | INC | PTR 1 | |
| | | 57 | STR | PTR 1 | |
| | | D5 | SEP | R5 | |
| 00BB | EQL9?: | F8 | LDI | | |
| | | F9 | | | |
| | | F7 | SM | | |
| | | 3A | BNZ | | INCRE |
| | | C3 | | | |
| 00C0 | | F8 | LDI | | |
| | | F0 | | | |
| | | 73 | STXD | | |
| 00C3 | INCRE: | F0 | LDX | | |
| | | FC | ADI | | |
| | | 01 | | | |
| | | 73 | STXD | | |
| 00C7 | | D5 | SEP | R5 | |

Time Set Output Subroutine (55 Bytes).  SCRT

| | | | | | |
|---|---|---|---|---|---|
| 00C8 | | F8 | LDI | | Last buffer area address. |
| | | 8C | | | |
| | | A8 | PLO | PTR 2 | |
| | | E8 | SEX | PTR 2 | |

|  |  | F8 | LDI |  |  |
|---|---|---|---|---|---|
|  |  | FF |  |  |  |
|  |  | 73 | STXD |  |  |
|  |  | 07 | LDN | PTR 1 |  |
| 00D0 | -------- | 73 | STXD |  |  |
|  |  | 27 | DEC | PTR 1 |  |
|  |  | 07 | LDN | PTR 1 |  |
|  |  | 73 | STXD |  |  |
|  |  | F8 | LDI |  | Code for "Clear Display" |
|  |  | FB |  |  |  |
|  |  | 58 | STR | PTR 2 |  |
| 00D7 | -------- | 3F | BN4 |  | Wait |
|  |  | D7 |  |  |  |
|  |  | 65 | OUT 5 |  |  |
| 00DA | -------- | 37 | B4 |  | Wait |
|  |  | DA |  |  |  |
| 00DC | -------- | 3F | BN4 |  | Wait |
|  |  | DC |  |  |  |
|  |  | 65 | OUT 5 |  |  |
| 00DF | -------- | 37 | B4 |  | Wait |
| 00E0 | -------- | DF |  |  |  |
| 00E1 | -------- | 3F | BN4 |  | Wait |
|  |  | E1 |  |  |  |
|  |  | 65 | OUT 5 |  |  |
| 00E4 | -------- | 37 | B4 |  | Wait |
|  |  | E4 |  |  |  |
| 00E6 | -------- | 3F | BN4 |  | Wait |
|  |  | E6 |  |  |  |
|  |  | 65 | OUT 5 |  |  |
|  |  | F8 | LDI |  |  |
|  |  | 66 |  |  |  |
|  |  | BD | PHI | COUNT |  |
| 00EC | LOOP1: | F8 | LDI |  |  |
|  |  | FF |  |  |  |
|  |  | AD | PLO | COUNT |  |
| 00EF | LOOP2: | 3C | BN1 |  | INCR6 |
| 00F0 | -------- | FC |  |  |  |
|  |  | FF | SMI |  |  |
|  |  | 01 |  |  |  |
|  |  | 3A | BNZ |  | LOOP2 |
|  |  | EF |  |  |  |
|  |  | 9D | GHI | COUNT |  |
|  |  | FF | SMI |  |  |
|  |  | 01 |  |  |  |
|  |  | BD | PHI | COUNT |  |
|  |  | 3A | BNZ |  | LOOP1 |
|  |  | EC |  |  |  |
|  |  | D5 | SEP | R5 |  |
| 00FC | INCR6: | 16 | INC | R6 |  |
|  |  | 16 | INC | R6 |  |
| 00FE | -------- | D5 | SEP | R5 |  |

Display Routine (114 Bytes)

|  |  |  |  |  |  |
|---|---|---|---|---|---|
| 0100 | FAIL?: | 35 | B2 |  | PFAIL |
|  |  | 73 |  |  |  |
| 0102 | AGAIN: | F8 | LDI |  | First "DAY" address. |
|  |  | 00 |  |  |  |
|  |  | A7 | PLO | PTR 1 |  |
|  |  | F8 | LDI |  |  |
|  |  | 0C |  |  | (#0C = 12D) |
|  |  | AE | PLO | S1CNT |  |
| 0108 | STPER: | F8 | LDI |  |  |
|  |  | 03 |  |  |  |
|  |  | BE | PHI | PER |  |
|  |  | F8 | LDI |  |  |
|  |  | 0A |  |  | (#0A = 10D) |
|  |  | AC | PLO | DISCO |  |
|  |  | 99 | GHI | FLAGS |  |
|  |  | FA | ANI |  |  |

| Addr | Byte | Op | Operand | Comment |
|---|---|---|---|---|
| 0110 | FD | | | 1111/1101 |
| | B9 | PHI | FLAGS | |
| | F8 | LDI | | Buffer area top address. |
| | 8D | | | |
| | A8 | PLO | PTR 2 | |
| | E7 | SEX | PTR 1 | |
| 0116 TRANS: | 72 | LDXA | | |
| | 58 | STR | PTR 2 | |
| | 2C | DEC | DISCO | |
| | 8C | GLO | DISCO | |
| | 32 | BZ | SETCO | |
| | 1F | | | |
| | 18 | INC | PTR 2 | |
| | 30 | BR | TRANS | |
| | 16 | | | |
| 011F SETCO: | F8 | LDI | | |
| 0120 | 0A | | | (#0A = 10D) |
| | AC | PLO | DISCO | |
| | F8 | LDI | | Buffer area top address. |
| | 8D | | | |
| | A8 | PLO | PTR 2 | |
| 0125 TSET?: | 34 | B1 | TSET | |
| | 5B | | | |
| | 3E | BN3 | ENABL | |
| | 2C | | | |
| | D4 | SEP | R4 | Call Pk. Dem. Reset subr. |
| | 02 | | | |
| | A0 | | | |
| 012C ENABL: | E3 | SEX | R3 | |
| | 70 | RET | | |
| | 33 | | | (X = P = 3) |
| | 37 | B4 | FLAG? | |
| 0130 | 35 | | | |
| 0131 FAIL: | 35 | B2 | PFAIL | |
| | 73 | | | |
| | 30 | BR | TSET? | |
| | 25 | | | |
| 0135 FLAG?: | 99 | GHI | FLAGS | |
| | FA | ANI | | |
| | 02 | | | 0000/0010 |
| | 3A | BNZ | EF4? | |
| 0139 | 3C | | | |

Display Routine, cont.

| Addr | Byte | Op | Operand | Comment |
|---|---|---|---|---|
| 013A | E8 | SEX | PTR 2 | |
| | 65 | OUT 5 | | |
| 013C EF4?: | 37 | B4 | EF4? | |
| | 3C | | | |
| 013E DECRO: | 2C | DEC | DISCO | |
| | 8C | GLO | DISCO | |
| 0140 | 3A | BNZ | FAIL | |
| | 31 | | | |
| | 99 | GHI | FLAGS | |
| | F9 | ORI | | |
| | 02 | | | 0000/0010 |
| | B9 | PHI | FLAGS | |
| | F8 | LDI | | (#0A = 10D) |
| | 0A | | | |
| | AC | PLO | DISCO | |
| | 29 | DEC | SECON | |
| | 89 | GLO | SECON | |
| | 32 | BZ | ONEMI | |
| | 61 | | | |
| 014D DEPER: | 9E | GHI | PER | |
| | FF | SMI | | |
| | 01 | | | |
| 0150 | BE | PHI | PER | |
| | 3A | BNZ | FAIL | |
| | 31 | | | |

|      |        | 2E | DEC | S1CNT |       |                                                      |
|------|--------|----|-----|-------|-------|------------------------------------------------------|
|      |        | 8E | GLO | S1CNT |       |                                                      |
|      |        | 3A | BNZ |       | STPER |                                                      |
|      |        | 08 |     |       |       |                                                      |
|      |        | 34 | B1  |       | TSET  |                                                      |
|      |        | 5B |     |       |       |                                                      |
|      |        | 30 | BR  |       | AGAIN |                                                      |
|      |        | 02 |     |       |       |                                                      |
| 015B | TSET:  | E3 | SEX | R3    |       |                                                      |
|      |        | 71 | DIS |       |       |                                                      |
|      |        | 33 |     |       |       | (X = P = 3)                                          |
|      |        | C0 | LBR |       | RS1   |                                                      |
|      |        | 00 |     |       |       |                                                      |
| 0160 | ------ | 40 |     |       |       |                                                      |
| 0161 | ONEMI: | 87 | GLO | PTR 1 |       |                                                      |
|      |        | 52 | STR | STACK |       |                                                      |
|      |        | 22 | DEC | STACK |       |                                                      |
|      |        | D4 | SEP | R4    |       | Call Incr. Time/Day subr.                            |
|      |        | 01 |     |       |       |                                                      |
|      |        | AE |     |       |       |                                                      |
|      |        | D4 | SEP | R4    |       | Call Time Compare subr.                              |
|      |        | 03 |     |       |       |                                                      |
|      |        | 8A |     |       |       |                                                      |
|      |        | D4 | SEP | R4    |       | Call Peak Demand subr.                               |
|      |        | 03 |     |       |       |                                                      |
|      |        | 00 |     |       |       |                                                      |
|      |        | 12 | INC | STACK |       |                                                      |
|      |        | 02 | LDN | STACK |       |                                                      |
|      |        | A7 | PLO | PTR 1 |       |                                                      |
| 0170 | ------ | 30 | BR  |       | DEPER |                                                      |
| 0171 | ------ | 4D |     |       |       |                                                      |

Power Fail Routine (59 Bytes)

|      |        | | | | | |
|------|--------|----|-----|-------|-------|------------------------------------------------------|
| 0173 | PFAIL: | E3 | SEX | R3    |       |                                                      |
|      |        | 71 | DIS |       |       |                                                      |
|      |        | 33 |     |       |       | (X = P = 3)                                          |
|      |        | 99 | GHI | FLAGS |       |                                                      |
|      |        | FA | ANI |       |       |                                                      |
|      |        | FA |     |       |       | 1111/1010                                            |
|      |        | B9 | PHI | FLAGS |       |                                                      |
| 017A | DECRS: | F8 | LDI |       |       | 0.999952 second delay.                               |
|      |        | E0 |     |       |       | (The ideal value would be                            |
|      |        | BD | PHI | COUNT |       | 0.9999562648 second.)                                |
| 017D | LUPE1: | F8 | LDI |       |       |                                                      |
|      |        | B8 |     |       |       |                                                      |
|      |        | AD | PLO | COUNT |       |                                                      |
| 0180 | LUPE2: | FF | SMI |       |       |                                                      |
|      |        | 01 |     |       |       |                                                      |
|      |        | 3E | BN3 |       | NORST |                                                      |
|      |        | 87 |     |       |       |                                                      |
|      |        | D4 | SEP | R4    |       | Call Pk. Dem. Reset subr.                            |
|      |        | 03 |     |       |       |                                                      |
|      |        | 00 |     |       |       |                                                      |
| 0187 | NORST: | 3A | BNZ |       | LUPE2 |                                                      |
|      |        | 80 |     |       |       |                                                      |
|      |        | 9D | GHI | COUNT |       |                                                      |
|      |        | FF | SMI |       |       |                                                      |
|      |        | 01 |     |       |       |                                                      |
|      |        | BD | PHI | COUNT |       |                                                      |
|      |        | 3A | BNZ |       | LUPE1 |                                                      |
|      |        | 7D |     |       |       |                                                      |
|      |        | 29 | DEC | SECON |       |                                                      |
| 0190 | ------ | 89 | GLO | SECON |       |                                                      |
|      |        | 3A | BNZ |       | PON?  |                                                      |
|      |        | AA |     |       |       |                                                      |
|      |        | F8 | LDI |       |       |                                                      |
|      |        | 3C |     |       |       | (#3C = 60D)                                          |
|      |        | A9 | PLO | SECON |       |                                                      |

|        |        | D4 | SEP | R4    | Call Incr. Time/Day subr. |
|--------|--------|----|-----|-------|---------------------------|
|        |        | 01 |     |       |                           |
|        |        | AE |     |       |                           |
|        |        | 99 | GHI | FLAGS |                           |
|        |        | FA | ANI |       |                           |
|        |        | 04 |     |       | 0000/0100                 |
|        |        | 3A | BNZ | PON?  |                           |
|        |        | AA |     |       |                           |
|        |        | 8B | GLO | PDPFR |                           |
|        |        | FF | SMI |       |                           |
| 01A0   |        | 01 |     |       |                           |
|        |        | 3A | BNZ | PKDEM |                           |
|        |        | A7 |     |       |                           |
|        |        | 99 | GHI | FLAGS |                           |
|        |        | F9 | ORI |       |                           |
|        |        | 04 |     |       | 0000/0100                 |
|        |        | B9 | PHI | FLAGS |                           |
| 01A7   | PKDEM: | D4 | SEP | R4    | Call Pk. Dem. subr.       |
|        |        | 03 |     |       |                           |
|        |        | 00 |     |       |                           |
| 01AA   | PON?:  | 35 | B2  | DECRS |                           |
|        |        | 7A |     |       |                           |
|        |        | 30 | BR  | AGAIN | (See Display Routine.)    |
| 01AD   |        | 02 |     |       |                           |

Increment Time/Day Subroutine (82 Bytes). SCRT

|      |      | F8 | LDI |       | Least sig. "TIME" byte. |
|------|------|----|-----|-------|-------------------------|
| 01AE |      | 12 |     |       |                         |
| 01B0 |      | A7 | PLO | PTR 1 |                         |
|      |      | F8 | LDI |       |                         |
|      |      | F9 |     |       |                         |
|      |      | BB | PHI | TEMP  |                         |
|      |      | D4 | SEP | R4    | Call INCTI subr.        |
|      |      | 03 |     |       |                         |
|      |      | ED |     |       |                         |
|      |      | 39 | BNQ | FINE  |                         |
|      |      | FC |     |       |                         |
|      |      | F8 | LDI |       |                         |
|      |      | F5 |     |       |                         |
|      |      | BB | PHI | TEMP  |                         |
|      |      | D4 | SEP | R4    | Call INCTI subr.        |
|      |      | 03 |     |       |                         |
|      |      | ED |     |       |                         |
|      |      | 39 | BNQ | FINE  |                         |
| 01C0 |      | FC |     |       |                         |
|      |      | F8 | LDI |       |                         |
|      |      | F9 |     |       |                         |
|      |      | BB | PHI | TEMP  |                         |
|      |      | D4 | SEP | R4    | Call INCTI subr.        |
|      |      | 03 |     |       |                         |
|      |      | ED |     |       |                         |
|      |      | 39 | BNQ | 23?   |                         |
|      |      | CF |     |       |                         |
|      |      | 07 | LDN | PTR 1 |                         |
|      |      | FC | ADI |       |                         |
|      |      | 01 |     |       |                         |
|      |      | 57 | STR | PTR 1 |                         |
|      |      | 30 | BR  | FINE  |                         |
|      |      | FC |     |       |                         |
| 01CF | 23?: | 07 | LDN | PTR 1 |                         |
| 01D0 |      | FF | SMI |       |                         |
|      |      | 01 |     |       |                         |
|      |      | 57 | STR | PTR 1 |                         |
|      |      | F8 | LDI |       |                         |
|      |      | F3 |     |       |                         |
|      |      | BB | PHI | TEMP  |                         |
|      |      | D4 | SEP | R4    | Call INCTI subr.        |
|      |      | 03 |     |       |                         |

```
              ED
              39   BNQ           FINE
              FC
              F8   LDI
              F2
              BB   PHI    TEMP
              D4   SEP    R4          Call INCTI subr.
              03
01E0 -------- ED
              31   BQ            INCDA
              ED
              07   LDN    PTR 1
              FF   SMI
01E5 -------- 01
```

Increment Time/Day Subroutine, Cont.

```
01E6 -------- 57   STR    PTR 1
              17   INC    PTR 1
              F8   LDI
              F4
              57   STR    PTR 1
              30   BR            FINE
              FC
01ED INCDA:   F8   LDI                Next-to-last "DAY" address.
              08
              A7   PLO    PTR 1
01F0 -------- F8   LDI
              F7
              BB   PHI    TEMP
              D4   SEP    R4          Call INCTI subr.
              03
              ED
              39   BNQ           FINE
              FC
              17   INC    PTR 1
              F8   LDI
              F1
              57   STR    PTR 1
01FC FINE:    F8   LDI
              3C                      (#3C = 60D)
              A9   PLO    SECON
01FF -------- D5   SEP    R5
```

Interrupt Subroutine (56 Bytes).

```
0204 INTEX:   42   LDA    STACK       Restore COUNT.0
              AD   PLO    COUNT
              42   LDA    STACK       Restore PTR 1.0
              A7   PLO    PTR 1
              42   LDA    STACK       Restore R3
              A3   PLO    R3
              42   LDA    STACK
              B3   PHI    R3
              42   LDA    STACK       Restore D
              70   RET                Restore X,P
020E INTPT:   22   DEC    STACK
              78   SAV                Save X,P
0210 -------- 22   DEC    STACK
              73   STXD               Save D
              93   GHI    R3          Save R3
              73   STXD
              83   GLO    R3
              73   STXD
              87   GLO    PTR 1       Save PTR 1.0
              73   STXD
              8D   GLO    COUNT       Save COUNT.0
              52   STR    STACK
              F8   LDI                Least sig "WH" byte.
```

```
              1C
              A7    PLO    PTR 1
0210 -------- F8    LDI              INCR    Instructions 021D through
              24                             0223 change the program
              A3    PLO    R3                counter to R3 so that the
0220 -------- F8    LDI                      SCRT can be used.
              02
              B3    PHI    R3
              D3    SEP    R3
0224  INCR:   D4    SEP    R4                Call ADD 7.2 WH subr.
              02
              43
              99    GHI    FLAGS
              FA    ANI
              01
              32    BZ            PDKW
              32
              F8    LDI                      Least sig. "PWH" byte.
              30
              A7    PLO    PTR 1
              D4    SEP    R4                Call ADD 7.2 WH subr.
0230 -------- 02
              43
0232  PDKW:   F8    LDI                      Least sig. "NEWPD" byte.
              7D
              A7    PLO    PTR 1
              D4    SEP    R4                Call ADD 28.8 W subr.
              02
              5C
              F8    LDI           INTEX
              04
              A1    PLO    R1
023B -------- D1    SEP    R1
```

Add 7.2 WH Subroutine (25 Bytes). SCRT

Note: PTR 1 must be set to the least significant "WH" byte before entering this subroutine.

```
0243 -------- F8    LDI
              02
              DA    SEP    RA                Call CARRY subr.
              27    DEC    PTR 1             Get past decimal point.
              80    GLO    R0
              FC    ADI
              07
              DA    SEP    RA                Call CARRY subr.
              80    GLO    R0
              DA    SEP    RA                Call CARRY subr.
              80    GLO    R0
              DA    SEP    RA                Call CARRY subr.
              87    GLO    PTR 1
0250 -------- FC    ADI
              0F                             (#0F = 15D)
              A7    PLO    PTR 1
              80    GLO    R0
              DA    SEP    RA                Call CARRY subr.
              80    GLO    R0
              DA    SEP    RA                Call CARRY subr.
              80    GLO    R0
              DA    SEP    RA                Call CARRY subr.
              80    GLO    R0
              DA    SEP    RA                Call CARRY subr.
025B -------- D5    SEP    R5
```

Add 28.8 Watts Subroutine (18 Bytes).  SCRT

Note:  PTR 1 must be set to the least significant "NEWPD" byte before entering this subroutine.

```
025C -------- F8    LDI
             08
             DA    SEP    RA              Call CARRY subr.
             80    GLO    R0
0260 -------- FC    ADI
             08
             DA    SEP    RA              Call CARRY subr.
             80    GLO    R0
             FC    ADI
             02
             DA    SEP    RA              Call CARRY subr.
             80    GLO    R0
             DA    SEP    RA              Call CARRY subr.
             80    GLO    R0
             DA    SEP    RA              Call CARRY subr.
             80    GLO    R0
             DA    SEP    RA              Call CARRY subr.
026D -------- D5    SEP    R5
```

Carry Subroutine (36 Bytes).  ShP (PC = RA).

Note:  O_ is in D.  PTR 1 is pointing to F_.

```
026E  EXIT1:  F8    LDI
              00
0270 -------- A0    PLO    R0
0271  EXIT2:  27    DEC    PTR 1
              D3    SEP    R3
0273  CARRY:  AD    PLO    COUNT
0274  LL1:    8D    GLO    COUNT
              32    BZ            EXIT1
              6E
              07    LDN    PTR 1
              FC    ADI
              01
              57    STR    PTR 1
              FF    SMI
              FA
              32    BZ            CRRY
              82
027F  CNT1:   2D    DEC    COUNT
0280 -------- 30    BR            LL1
              74
0282  CRRY:   F8    LDI
              01
              A0    PLO    R0
              F8    LDI
              F0
              57    STR    PTR 1
0288  CNT2:   2D    DEC    COUNT
              8D    GLO    COUNT
              32    BZ            EXIT2
              71
              07    LDN    PTR 1
              FC    ADI
              01
              57    STR    PTR 1
0290 -------- 30    BR            CNT2
0291 -------- 88
```

Peak Demand Reset Subroutine (44 Bytes).   SCRT

```
02A0 -------- E3    SEX    R3
               71    DIS
               33                            (X = P = 3)
               87    GLO    PTR 1
               BB    PHI    TEMP
               F8    LDI                     Next-to-last "PDTIM" address.
               6C
               A7    PLO    PTR 1
               E7    SEX    PTR 1
               F8    LDI
               F0
               73    STXD                    Set PDTIM = 0
               73    STXD                     "    "    "
               73    STXD                     "    "    "
               73    STXD                     "    "    "
               F8    LDI                     Next-to-last "PDDAY" address.
02B0 -------- 62
               A7    PLO    PTR 1
               F8    LDI
               F0
               73    STXD                    Set PDDAY = 0.
               F8    LDI                     Least sig. "PDKW" byte.
               58
               A7    PLO    PTR 1
               F8    LDI
               F0
               73    STXD                    Set PDKW = 0
               73    STXD                     "    "    "
               27    DEC    PTR 1             "    "    "
               73    STXD                     "    "    "
               73    STXD                     "    "    "
               F8    LDI                     Least sig. "KW" byte.
02C0 -------- 77
               A7    PLO    PTR 1
               F8    LDI
               F0
               73    STXD                    Set KW = 0
               73    STXD                     "    "    "
               27    DEC    PTR 1             "    "    "
               73    STXD                     "    "    "
               73    STXD                     "    "    "
               9B    GHI    TEMP
               A7    PLO    PTR 1
02CB -------- D5    SEP    R5
```

Peak Demand Subroutine (128 Bytes).   SCRT

```
0300 -------- E3    SEX    R3
               71    DIS
               33                            (X = P = 3)
               8B    GLO    PDPER
               FF    SMI
               01
               AB    PLO    PDPER
               3A    BNZ           RTN
               7F
0309 PDRST:   F8    LDI                     (#0F = 15D)
               0F
               AB    PLO    PDPER
               F8    LDI                     Most sig. "PDKW" address.
               54
               A8    PLO    PTR 2
               F8    LDI                     First "NEWPD" address.
0310 -------- 78
               A7    PLO    PTR 1
               E7    SEX    PTR 1
```

|      |        | 08 | LDN  | PTR 2 | Old PD to D. |
|------|--------|----|------|-------|--------------|
|      |        | F7 | SM   |       | Subtr. Old PD from New PD. |
|      |        | 32 | BZ   | CNTN1 | BR if New PD = Old PD. |
|      |        | 1B |      |       |              |
|      |        | 3B | BM   | REPL  | BR if New PD > Old PD. |
|      |        | 38 |      |       |              |
|      |        | 30 | BR   | RESET | BR if New PD < Old PD. |
|      |        | 62 |      |       |              |
| 031B | CNTN1: | 17 | INC  | PTR 1 |              |
|      |        | 18 | INC  | PTR 2 |              |
|      |        | 08 | LDN  | PTR 2 |              |
|      |        | F7 | SM   |       |              |
|      |        | 32 | BZ   | CNTN2 |              |
| 0320 |        | 25 |      |       |              |
|      |        | 3B | BM   | REPL  |              |
|      |        | 38 |      |       |              |
|      |        | 30 | BR   | RESET |              |
|      |        | 62 |      |       |              |
| 0325 | CNTN2: | 17 | INC  | PTR 1 |              |
|      |        | 18 | INC  | PTR 2 |              |
|      |        | 18 | INC  | PTR 2 | Get past the decimal point. |
|      |        | 08 | LDN  | PTR 2 |              |
|      |        | F7 | SM   |       |              |
|      |        | 32 | BZ   | CNTN3 |              |
|      |        | 30 |      |       |              |
|      |        | 3B | BM   | REPL  |              |
|      |        | 38 |      |       |              |
|      |        | 30 | BR   | RESET |              |
|      |        | 62 |      |       |              |
| 0330 | CNTN3: | 17 | INC  | PTR 1 |              |
|      |        | 18 | INC  | PTR 2 |              |
|      |        | 08 | LDN  | PTR 2 |              |
|      |        | F7 | SM   |       |              |
|      |        | 3B | BM   | REPL  |              |
|      |        | 38 |      |       |              |
|      |        | 30 | BR   | RESET |              |
| 0337 |        | 62 |      |       |              |

Peak Demand Subroutine, Cont.

|      |       |    |      |       |                            |
|------|-------|----|------|-------|----------------------------|
| 0338 | REPL: | F8 | LDI  |       | Least sig. "PDKW" byte.    |
|      |       | 58 |      |       |                            |
|      |       | A7 | PLO  | PTR 1 |                            |
|      |       | F8 | LDI  |       | Fourth "NEWPD" byte.       |
|      |       | 7B |      |       |                            |
|      |       | A8 | PLO  | PTR 2 |                            |
|      |       | 08 | LDN  | PTR 2 |                            |
|      |       | 73 | STXD |       |                            |
| 0340 |       | 28 | DEC  | PTR 2 |                            |
|      |       | 08 | LDN  | PTR 2 |                            |
|      |       | 73 | STXD |       |                            |
|      |       | 28 | DEC  | PTR 2 |                            |
|      |       | 27 | DEC  | PTR 1 |                            |
|      |       | 08 | LDN  | PTR 2 |                            |
|      |       | 73 | STXD |       |                            |
|      |       | 28 | DEC  | PTR 2 |                            |
|      |       | 08 | LDN  | PTR 2 |                            |
|      |       | 73 | STXD |       |                            |
|      |       | F8 | LDI  |       | Next-to-last "TIME" address. |
|      |       | 12 |      |       |                            |
|      |       | A8 | PLO  | PTR 2 |                            |
|      |       | F8 | LDI  |       | Next-to-last "PDTIM" address. |
|      |       | 6C |      |       |                            |
|      |       | A7 | PLO  | PTR 1 |                            |
| 0350 |       | F8 | LDI  |       |                            |
|      |       | 04 |      |       |                            |
|      |       | AD | PLO  | COUNT |                            |
| 0353 | TIME1:| 08 | LDN  | PTR 2 |                            |
|      |       | 73 | STXD |       |                            |

```
             28   DEC     PTR 2
             2D   DEC     COUNT
             8D   GLO     COUNT
             3A   BNZ             TIME1
             53
             F8   LDI                        Next-to-last "DAY" address.
             08
             A8   PLO     PTR 2
             F8   LDI                        Next-to-last "PDDAY" address.
             62
             A7   PLO     PTR 1
0360 ------- 08   LDN     PTR 2
             57   STR     PTR 1
0362 RESET:  F8   LDI                        Fourth "NEWPD" byte.
             7B
             A8   PLO     PTR 2
             F8   LDI                        Least sig. "kw" byte.
             77
0367 ------- A7   PLO     PTR 1
```

Peak Demand Subroutine, Cont.

```
0368 ------- 08   LDN     PTR 2
             73   STXD
             28   DEC     PTR 2
             08   LDN     PTR 2
             73   STXD
             28   DEC     PTR 2
             27   DEC     PTR 1          Get past the decimal point.
             08   LDN     PTR 2
0370 ------- 73   STXD
             28   DEC     PTR 2
             08   LDN     PTR 2
             73   STXD
             F8   LDI                        Last "NEWPD" address.
             7D
             A7   PLO     PTR 1
             F8   LDI
             F0
             73   STXD
             73   STXD
             73   STXD
             73   STXD
             73   STXD
             73   STXD
037F RTN:    D5   SEP     R5
```

Time Compare Subroutine (67 Bytes).

```
038A ------- F8   LDI                        Least sig. "TIME" byte.
             12
             A7   PLO     PTR 1
             F8   LDI                        Least sig. "PSTRT" byte.
             44
             AF   PLO     ROMPT
0390 ------- EF   SEX     ROMPT
             07   LDN     PTR 1
             F7   SM
             3A   BNZ             CEND
             AC
             2F   DEC     ROMPT
             27   DEC     PTR 1
             07   LDN     PTR 1
             F7   SM
             3A   BNZ             CEND
             AC
             2F   DEC     ROMPT
             27   DEC     PTR 1
```

```
                07   LDN    PTR 1
                F7   SM
                3A   BNZ           CEND
03A0 -------- AC
                2F   DEC    ROMPT
                27   DEC    PTR 1
                07   LDN    PTR 1
                F7   SM
                3A   BNZ           CEND
                AC
                99   GHI    FLAGS
                F9   ORI
                01
                B9   PHI    FLAGS
                D5   SEP    R5
03AC  CEND:    F8   LDI                    Least sig. "TIME" byte.
                12
                A7   PLO    PTR 1
                F8   LDI                    Least sig. "PEND" byte.
03B0 --------  4E
                AF   PLO    ROMPT
                07   LDN    PTR 1
                F7   SM
                3A   BNZ           FINIS
                CC
                2F   DEC    ROMPT
                27   DEC    PTR 1
                07   LDN    PTR 1
                F7   SM
                3A   BNZ           FINIS
03BB -------- CC
```

Time Compare Subroutine, Cont.

```
03BC -------- 2F   DEC    ROMPT
               27   DEC    PTR 1
               07   LDN    PTR 1
               F7   SM
03C0 -------- 3A   BNZ           FINIS
               CC
               2F   DEC    ROMPT
               27   DEC    PTR 1
               07   LDN    PTR 1
               F7   SM
               3A   BNZ           FINIS
               CC
               99   GHI    FLAGS
               FA   ANI
               FE                          1111/1110
               B9   PHI    FLAGS
03CC  FINIS:   D5   SEP    R5
```

Call Subroutine (16 Bytes). SEP (PC = R4).
    30 Machine cycles.

```
03CF  EXITA:   D3   SEP    R3
03D0  CALL:    E2   SEX    R2
               96   GHI    R6
               73   STXD
               86   GLO    R6
               73   STXD
               93   GHI    R3
               B6   PHI    R6
               83   GLO    R3
               A6   PLO    R6
               46   LDA    R6
               B3   PHI    R3
               46   LDA    R6
               A3   PLO    R3
               30   BR            EXITA
03DE -------- CF
```

Return Subroutine (13 Bytes). SEP(PC = R5).
    24 Machine cycles.

```
03DF  EXITR:  D3      SEP     R3
03E0  RETPG:  96      GHI     R6
              B3      PHI     R3
              86      GLO     R6
              A3      PLO     R3
              E2      SEX     R2
              12      INC     R2
              72      LDXA
              A6      PLO     R6
              F0      LDX
              B6      PHI     R6
              30      BR              EXITR
03EB  -------- DF
```

INCTI (Increment Time) Subroutine (17 Bytes). SCRT

```
03ED  -------- 9B     GHI     TEMP
               E7     SEX     PTR 1
               F7     SM
03F0  -------- 3A     BNZ             PLUS
               F8
               F8     LDI
               F0
               57     STR     PTR 1
               27     DEC     PTR 1
               7B     SEQ
               D5     SEP     R5
03F8  PLUS:    07     LDN     PTR 1
               FC     ADI
               01
               57     STR     PTR 1
               7A     REQ
03FD  -------- D5     SEP     R5
```

ROM Data (Loaded in RAM)

| Addr | Label | Val | Addr | Label | Val | Addr | Label | Val | |
|---|---|---|---|---|---|---|---|---|---|
| 0400 | DAY | FB | 043C | PSTRT | FB | 0478 | NEWPD | F0 | |
| 1 | | F0 | D | | F0 | 9 | | F0 | |
| 2 | | F1 | E | | F7 | A | | F0 | |
| 3 | | F0 | F | | F0 | B | | F0 | |
| 4 | | F0 | 0440 | | F0 | C | | F0 | |
| 5 | | F0 | 1 | | FW * | | D | | F0 | ←—126 |
| 6 | | F0 | 2 | | FX | 047E | R1.0 | 0E | positions |
| 7 | | F0 | 3 | | FY | F | R2.0 | 8C | to here |
| 8 | | F1 | 4 | | FZ | 0480 | R3.0 | 38 | |
| 9 | | FF | 5 | | FF | 1 | R4.0 | D0 | |
| 040A | TIME | FB | 0446 | PEND | FB | 2 | R5.0 | E0 | |
| B | | F0 | 7 | | F0 | 3 | R7.0 | 00 | |
| C | | F2 | 8 | | F8 | 4 | R9.0 | 3C | (= 60D) |
| D | | F0 | 9 | | F0 | 5 | RA.0 | 73 | |
| E | | F0 | A | | F0 | 6 | RB.0 | 0F | (= 15D) |
| F | | F0 | B | | FM ** | | 7 | RD.0 | 7E | (= 126D) |
| 0410 | | F0 | C | | FN | 8 | R1.1 | 02 | |
| 1 | | F0 | D | | FP | 9 | R2.1 | 05 | |
| 2 | | F0 | E | | FQ | A | R3.1 | 00 | |
| 3 | | FF | F | | FF | B | R4.1 | 03 | |
| 0414 | WH | FB | 0450 | PDKW | FB | C | R5.1 | 03 | |
| 5 | | F3 | 1 | | F9 | D | R7.1 | 05 | |
| 6 | | F0 | 2 | | F0 | E | R8.1 | 05 | |
| 7 | | F0 | 3 | | F0 | 048F | RA.1 | 02 | ←—144 |
| 8 | | F0 | 4 | | F0 | | | | positions |
| 9 | | F0 | 5 | | F0 | | | | to here |
| A | | F0 | 6 | | FA | *Peak Interval Start Time |
| B | | FA | 7 | | F0 |  = WX:YZ Military Time |
| C | | F0 | 8 | | F0 | |
| D | | FF | 9 | | FF | **Peak Interval End Time |
| 041E | KwH | FB | 045A | PDDAY | FB |  = MN:PQ Military Time |
| F | | F0 | B | | F1 | |

| | | | | | |
|---|---|---|---|---|---|
| 0420 | | F4 | C | | F0 |
| 1 | | F0 | D | | F0 |
| 2 | | F0 | E | | F0 |
| 3 | | F0 | F | | F0 |
| 4 | | F0 | 0460 | | F0 |
| 5 | | F0 | 1 | | F0 |
| 6 | | F0 | 2 | | F0 |
| 7 | | FF | 3 | | FF |
| 0428 | PWH | FB | 0464 | PDTIM | FB |
| 9 | | F5 | 5 | | F1 |
| A | | F0 | 6 | | F1 |
| B | | F0 | 7 | | F0 |
| C | | F0 | 8 | | F0 |
| D | | F0 | 9 | | F0 |
| E | | F0 | A | | F0 |
| F | | FA | B | | F0 |
| 0430 | | F0 | C | | F0 |
| 1 | | FF | D | | FF |
| 0432 | PKWH | FB | 046E | KW | FB |
| 3 | | F0 | F | | F1 |
| 4 | | F6 | 0470 | | F2 |
| 5 | | F0 | 1 | | F0 |
| 6 | | F0 | 2 | | F0 |
| 7 | | F0 | 3 | | F0 |
| 8 | | F0 | 4 | | F0 |
| 9 | | F0 | 5 | | FA |
| A | | F0 | 6 | | F0 |
| B | | FF | 7 | | F0 *** |

\*\*\*"FF" is necessary in the 10th position only when the display is not filled up; that is, when a leading zero is to be blanked. It is optional with a two-digit index. When there is both a two-digit index and a decimal point, as in this case, it can<u>not</u> be used.

RAM Data

| | | |
|---|---|---|
| 0500 ⎫<br>⎬<br>057D ⎭ | Data in these 126 positions corresponds to that in the first 126 positions of ROM data (memory page 4). Initially they are identical (just after RESET). | |
| 057E<br>F<br>0580<br>1<br>2<br>3<br>4<br>5<br>6<br>7<br>8<br>9<br>A<br>B<br>C | STACK 1<br>↓<br>15 | |
| 058D<br>E<br>F<br>0590<br>1<br>2<br>3<br>4<br>5<br>6 | BUFFER 1<br>↓<br>10 | |

Register Assignments

| | | |
|---|---|---|
| SPC | R0 | Start-up program counter. Temporary "carry" storage in the CARRY subr. |
| IPC | R1 | Interrupt program counter. |
| STACK | R2 | Stack pointer. |
| MPC | R3 | Main program counter. |

| | | |
|---|---|---|
| CALL | R4 | CALL subr. program counter. |
| RETPG | R5 | RETURN subr. program counter. |
| SAVE | R6 | Return location pointer. |
| PTR 1 | R7 | RAM pointer. |
| PTR 2 | R8 | RAM pointer. |
| FLAGS | R9.1 | Flag bits for peak interval, display routine (output flag), and peak demand. See bottom of the page for bit locations. |
| SECON | R9.0 | Seconds counter. |
| CARRY | RA | CARRY subroutine program counter. |
| TEMP | RB.1 | Temporary data storage. |
| PDPER | RB.0 | Peak demand period count. |
| DISCO | RC.0 | Display counter. |
| COUNT | RD | Delay count 1 in high byte, delay count 2 in low byte. The low byte is also used in the INTERRUPT subroutine, the CARRY subroutine, and in the INITIALIZATION routine. |
| PER | RE.1 | Display period count. |
| S1CNT | RE.0 | Switch 1 count. Also, display cycle counter. |
| ROMPT | RF | ROM pointer. |
| | RC.1 | Not used. |

FLAG bit locations: 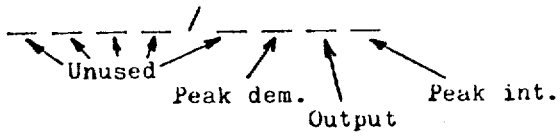
Unused   Peak dem.   Output   Peak int.

Routines and Subroutines.

| | Addresses | No. of Bytes | |
|---|---|---|---|
| Initialization | 0000 - 003C incl. | 61 | |
| Time Set Routine | 0040 - 00A7 incl. | 104 | |
| STPTI Subroutine | 00A8 - 00C7 incl. | 32 | |
| Time Set Output Subr. | 00C8 - 00FE incl. | 55 | 252 tot., p.0 |
| Display Routine | 0100 - 0171 incl. | 114 | |
| Power Fail Routine | 0173 - 01AD incl. | 59 | |
| Increment Time/Day Subr. | 01AE - 01FF incl. | 82 | 255 tot., p.1 |
| Interrupt Subroutine | 0204 - 023B incl. | 56 | |
| Add 7.2 WH Subroutine | 0243 - 025B incl. | 25 | |
| Add 28.8 W Subroutine | 025C - 026D incl. | 18 | |
| Carry Subroutine | 026E - 0291 incl. | 36 | |
| Peak Demand Reset Subr. | 02A0 - 02CB incl. | 44 | 179 tot., p.2 |

| | | |
|---|---|---|
| Peak Demand Subroutine | 0300 - 037F incl. | 128 |
| Time Compare Subroutine | 038A - 03CC incl. | 67 |
| Call Subroutine | 03CF - 03DE incl. | 16 |
| Return Subroutine | 03DF - 03EB incl. | 13 |
| INCTI Subroutine | 03ED - 03FD incl. | 17 | 241 tot., p.3 |

Memory Requirement

| | No. of Bytes | Page |
|---|---|---|
| Initialization | 61 | 0 |
| Time Set Routine | 104 | 0 |
| Step Time (STPTI) Subroutine | 32 | 0 |
| Time Set Output Subroutine | 55 | 0 |
| Display Routine | 114 | 1 |
| Power Fail Routine | 59 | 1 |
| Increment Time/Day Subroutine | 82 | 1 |
| Interrupt Subroutine | 56 | 2 |
| Add 7.2 Watt-hours Subroutine | 25 | 2 |
| Add 28.8 Watts Subroutine | 18 | 2 |
| Carry Subroutine | 36 | 2 |
| Peak Demand Reset Subroutine | 44 | 2 |
| Peak Demand Subroutine | 128 | 3 |
| Time Compare Subroutine | 67 | 3 |
| Call Subroutine | 16 | 3 |
| Return Subroutine | 13 | 3 |
| Increment Time (INCTI) Subroutine | 17 | 3 |

927 total, program only.

| | |
|---|---|
| Page 0: | 252 Bytes |
| Page 1: | 255 Bytes |
| Page 2: | 179 Bytes |
| Page 3: | 241 Bytes |
| Page 4: | 144 Bytes (ROM Data) |
| Page 5: | 151 Bytes (RAM Data) |

1222 Bytes Total Including ROM Data and RAM Data.

Output Code

| Data Output | Corresponding Calculator key |
|---|---|
| F0 | 0 |
| F1 | 1 |
| F2 | 2 |
| F3 | 3 |
| F4 | 4 |
| F5 | 5 |

| | |
|---|---|
| F6 | 6 |
| F7 | 7 |
| F8 | 8 |
| F9 | 9 |
| FA | . (decimal point) |
| FB | CE (clear entry) |

We claim:

1. A digital processing A.C. electric energy metering and display system comprising:

a kilowatthour meter comprising a transparent cover and a rotary disc and means responsive to the voltage and current on an A.C. power line for rotating said disc in accordance with the electric energy usage at a consumer station supplied by said power line so that each rotary increment of said disc represents a predetermined quantity of A.C. electric energy, said disc having a mark thereon that is detected when it has moved through said rotary increment to reach a given point;

a radiant energy detector having means for monitoring said given point without imposing any forces on said meter disc so as not to effect disc calibration or metering accuracy and for providing an input electric signal each time said mark passes said given point for use in said system;

mounting means on said meter for mounting said radiant energy detector in proper orientation with respect to said disc within said transparent cover so as to detect said mark as it passes said given point;

a plural digit electronic display and means supporting the same on said mounting means so that it can be viewed through said transparent cover of the meter;

a microcomputer comprising:

memory means for storing data;

a program stored in said memory means;

a microprocessor connected to said memory means;

and output port means for outputting data to said display in said meter under the control of said microprocessor;

timing signal interfacing means responsive to said power line voltage frequencey for providing timing pulses including means providing a predetermined number of logic level time-keeping pulses per second to said microprocessor;

control means comprising energy signal interfacing means responsive to said input electric signal from said meter disc mark detector and comprising also said micro-processor responsive to said time-keeping pulses and said program for calculating the day of the week, the time of day, the total watthours and/or kilowatthours of energy used, and the peak interval watthours and/or kilowatthours used and for registering the same;

said control means also comprising peak demand means responsive to said input electric signal from said meter disc mark detector and said time-keeping pulses and said program for calculating the peak power demand in kilowatts during one of a multiplicity of demand periods of predetermined programmed length and the day of the week and time of such peak power demand and for registering the same for display;

and said control means comprising means for sequentially transferring data including said total watthours and/or kilowatthours and said peak interval watthours and/or kilowatthours and said peak demand kilowatts and said day and time of peak demand to said plural digit electronic display along with respective identification numbers separated therefrom on said display in a predetermined automatic manner.

2. The digital processing A.C. electric energy metering and display system claimed in claim 1, wherein:

said control means also comprises time-setting means comprising a data input means and interfacing logic circuit means coupling said data input means to said microprocessor and being responsive to input of said data for setting the day of the week, the hour of the day and the minute of the hour to a desired setting from which said control means continues to calculate the same in response to said time-keeping pulses.

3. The digital processing A.C. electric energy metering and display system claimed in claim 1, wherein:

said microcomputer also comprises internal oscillator means for running said microprocessor and said program;

and said control means also comprises power fail detector means responsive to termination of said timing pulses for a predetermined timed interval upon power failure for signaling said microprocessor to transfer the day and time calculation from said time-keeping pulses theretofore derived from the power line to be controlled by said oscillator controlled program in order to continue the time-keeping while the power is off.

4. The digital processing A.C. electric energy metering and display system claimed in claim 1, wherein:

said system also comprises D.C. power supply means comprising:

circuit means supplied from said power line for providing a D.C. electric supply affording operating voltage for said system;

a rechargeable standby battery;

and means connecting said standby battery in said circuit means for automatically providing said operating voltage in the event of power failure on said power line.

5. The digital processing A.C. electric energy metering and display system claimed in claim 4, wherein:

said system further comprises a battery charger;

and means connecting said battery charger in said circuit means to maintain said standby battery charged when said power is on said power line.

6. The digital processing A.C. electric energy metering and display system claimed in claim 1, wherein:

said control means comprises means for displaying said day of the week and said time of day on said electronic display in two steps with programmed display time.

7. The digital processing A.C. electric energy metering and display system claimed in claim 1, wherein:
said radiant energy detector is an optical pickup having a light source for impinging light on said disc in the path of movement of said mark and a photo-electric device for receiving a reflection of said light from said disc that is pulsed as said mark passes said given point to provide said input electric signal;
and said mounting means is a face plate on said meter within said transparent cover and a bracket secured to said face plate for holding said optical pickup and aimed at said disc.

8. The digital processing A.C. electric energy metering and display system claimed in claim 1, wherein:
said means for transferring said total watthours and/or kilowatthours and said peak interval watthours and/or kilowatthours and said peak demand kilowatthours and said day and time of peak demand to said plural digit electronic display comprises means for effecting a decimal visual display thereof in respective plural digit steps each having a predetermined dwell time.

9. The digital processing A.C. electric energy metering and display system claimed in claim 1, wherein:
said kilowatthour meter also comprises a set of mechanical dials;
said means responsive to the voltage and current on said A.C. power line for operating said dials to register the electric energy usage at said consumer station in a normal analog manner which registration can be used to check and verify the proper operation of said digital processing A.C. electric energy metering and display system.

10. A digital processing A.C. electric energy metering and display system comprising:
a kilowatthour meter comprising a transparent cover and a rotary disc and means responsive to the voltage and current on an A.C. power line for rotating said disc in accordance with the electric energy usage at a consumer station supplied by said power line so that each rotary increment of said disc represents a predetermined quantity of A.C. electric energy, said disc having a mark thereon that is detected when it has moved through said rotary increment to reach a given point;
a radiant energy detector having means for monitoring said given point without imposing any forces on said meter disc so as not to affect disc calibration or metering accuracy and for providing an input electric signal each time said mark passes said given point for use in said system;
mounting means on said meter for mounting said radiant energy detector in proper orientation with respect to said disc within said transparent cover so as to detect said mark as it passes said given point;
an electronic display and means supporting the same on said mounting means so that it can be viewed through said transparent cover of the meter;
a microcomputer comprising:
memory means for storing data;
a program stored in said memory means;
a microprocessor connected to said memory means;
and output port means for outputting data to said display in said meter under the control of said microprocessor;
timing signal interfacing means responsive to said power line voltage frequency for providing timing pulses including means providing a predetermined number of logic level time-keeping pulses per second to said microprocessor;
control means comprising energy signal interfacing means responsive to said input electric signal from said meter disc mark detector and comprising also said micro-computer responsive to said time-keeping pulses and said program for calculating the day of the week, the time of day, the total kilowatthours and/or watthours of energy used, and the peak interval kilowatthours and/or watthours used and for registering the same;
and said control means comprising means for transferring said total kilowatthours and/or watthours and said peak interval kilowatthours and/or watthours to said electronic display in a predetermined controllable manner;
said control means also comprising peak demand means comprising means for computing the average power demand during a first demand period and storing the same in an old-peak-demand storage device, means for computing the average power demand during a subsequent demand period which may overlap or succeed said first demand period and storing the same in a new-peak-demand storage device, and means for comparing the new peak demand with the old peak demand and replacing the latter with it in said old peak demand storage device if it is larger than the old peak demand.

11. The digital processing A.C. electric energy metering and display system claimed in claim 10, wherein:
said peak demand means also comprises means for storing the day and time corresponding to the end of said first demand period in a storage device, and means for replacing the same with the day and time corresponding to the end of said subsequent demand period if said new peak demand was found to be larger than said old peak demand as a result of said comparison.

12. The digital processing A.C. electric energy metering and display system claimed in claim 10, wherein:
said control means also comprises means for transferring the data from said new-peak-demand storage device at the end of the corresponding demand period to said display for display as the present demand.

* * * * *